US 8,922,020 B2

(12) United States Patent
Chen et al.

(10) Patent No.: US 8,922,020 B2
(45) Date of Patent: Dec. 30, 2014

(54) INTEGRATED CIRCUIT PATTERN AND METHOD

(75) Inventors: Shih-Hung Chen, Jhudong Township, Hsinchu County (TW); Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 120 days.

(21) Appl. No.: 12/983,832

(22) Filed: Jan. 3, 2011

(65) Prior Publication Data

US 2012/0168955 A1 Jul. 5, 2012

(51) Int. Cl.
*H01L 23/48* (2006.01)
*H01L 27/115* (2006.01)
*H01L 21/033* (2006.01)
*H01L 23/528* (2006.01)

(52) U.S. Cl.
CPC ...... *H01L 27/11573* (2013.01); *H01L 21/0337* (2013.01); *H01L 21/0338* (2013.01); *H01L 23/528* (2013.01); *H01L 27/11565* (2013.01); Y10S 438/947 (2013.01)
USPC ............ 257/773; 257/E29.135; 257/E29.136; 257/E29.112; 257/692; 438/671; 438/717; 438/947

(58) Field of Classification Search
CPC ............ H01L 21/0337; H01L 21/0338; H01L 23/528; H01L 23/5286; H01L 27/11573
USPC ........... 257/773, E29.135, E29.136, E29.112, 257/692; 438/947, 671, 717
See application file for complete search history.

(56) References Cited

U.S. PATENT DOCUMENTS

| 7,279,707 | B2 * | 10/2007 | Chen et al. ...................... 257/48 |
| 7,534,723 | B2 | 5/2009 | Park et al. |
| 7,651,951 | B2 | 1/2010 | Tran et al. |
| 8,110,506 | B2 * | 2/2012 | Min et al. ...................... 438/736 |
| 8,310,055 | B2 * | 11/2012 | Park et al. ...................... 257/773 |
| 2003/0025147 | A1 * | 2/2003 | Nomoto et al. ............... 257/314 |
| 2005/0272259 | A1 | 12/2005 | Hong |

(Continued)

OTHER PUBLICATIONS

Xie, P. et al.; Analysis of higher order pitch division for sub-32nm lithography; Proceedings of SPIE vol. 7274 71741Y; © 2009; 8 pages.

(Continued)

*Primary Examiner* — Kimberly Rizkallah
*Assistant Examiner* — Maria Ligai
(74) *Attorney, Agent, or Firm* — James F. Hann; Haynes Beffel & Wolfeld LLP

(57) ABSTRACT

An integrated circuit pattern comprises a set of lines of material having X and Y direction portions. The X and Y direction portions have first and second pitches, the second pitch being larger, such as at least 3 times larger, than the first pitch. The X direction portions are parallel and the Y direction portions are parallel. The end regions of the Y direction portions comprise main line portions and offset portions. The offset portions comprise offset elements spaced apart from and electrically connected to the main line portions. The offset portions define contact areas for subsequent pattern transferring procedures. A multiple patterning method, for use during integrated circuit processing procedures, provides contact areas for subsequent pattern transferring procedures.

12 Claims, 25 Drawing Sheets

(56) References Cited

U.S. PATENT DOCUMENTS

| | | |
|---|---|---|
| 2007/0215874 A1 | 9/2007 | Furukawa et al. |
| 2008/0006869 A1* | 1/2008 | Kamigaichi et al. ........... 257/315 |
| 2008/0017996 A1* | 1/2008 | Sato et al. ...................... 257/784 |
| 2008/0057692 A1 | 3/2008 | Wells et al. |
| 2009/0224336 A1* | 9/2009 | Liu et al. ........................ 257/401 |
| 2009/0261479 A1 | 10/2009 | Hong |
| 2010/0244269 A1* | 9/2010 | Kim .............................. 257/773 |
| 2011/0103147 A1* | 5/2011 | Park et al. ................. 365/185.17 |

OTHER PUBLICATIONS

Wikipedia, Double Patterning, downloaded on Jul. 29, 2010, 14 pages.
Office Action in Corresponding Taiwan Patent Application No. 100103131; mailed Sep. 11, 2013; 6 pp.
Office Action in Corresponding Chinese Patent Application No. 201110028133.6; mailed Jan. 23, 2014; 8 pp.

* cited by examiner

INTEGRATED CIRCUIT PATTERN AND METHOD

CROSS-REFERENCE TO OTHER APPLICATIONS

This application is related to the commonly assigned U.S. patent application Ser. No. 12/981,121, filed on 29 Dec. 2010, entitled Multiple Patterning Method.

BACKGROUND OF THE INVENTION

1. Field of the Invention

The present invention relates to integrated circuit patterns and their fabrication, including the use of multiple patterning methods to fabricate integrated circuits by which access to the lines of material formed thereby is facilitated.

2. Description of Related Art

Integrated circuits are commonly used to make a wide variety of electronic devices, such as memory chips. There is a strong desire to reduce the size of integrated circuits, so as to increase the density of the individual components and consequently enhance the functionality of an integrated circuit. The minimum pitch on an integrated circuit (the minimum distance between the same points of two adjacent structures of the same type, e.g., two adjacent gate conductors) is often used as a representative measure of the circuit's density.

Increases in circuit density often are limited by the resolution of the available photolithographic equipment. The minimum size of features and spaces that a given piece of photolithographic equipment can produce is related to its resolution capacity.

The sum of the minimum feature width and minimum space width producible with a given piece of photolithographic equipment is the minimum pitch that the piece of equipment can produce. The minimum feature width can often times be approximately equal to the minimum space width, so the minimum pitch that can be produced with a given piece of photolithographic equipment is approximately equal to double the minimum feature width that it can produce.

One way to reduce the pitch of an integrated circuit device below that of the minimum pitch produced lithographically is through the use of double or quadruple patterning, sometimes referred to as multiple patterning herein. Through this method a single mask is typically used to create a series of parallel lines of material on the substrate. Different methods can then be used to transform each parallel line of material into multiple parallel lines of material. The various methods typically use a series of deposition and etching steps to do so. Different methods are discussed in Xie, Peng and Smith, Bruce W., "*Analysis of Higher-Order Pitch Division for Sub-32 nm Lithography*", Optical Microlithography XXII, Proc. of SPIE Vol. 7274, 72741Y, © 2009 SPIE. One method, discussed in the example below, uses self aligned sidewall spacers to create, typically, two or four parallel lines material for each line of material created from the original mask.

SUMMARY OF THE INVENTION

The present invention is based in part on the recognition of the problems created by reducing the pitch to sub lithographic dimensions. That is, while the pitch between the lines material may be sub lithographic, the requirements for accessing the lines, typically through an access element such as a vertical plugs, may not be completely compatible with the sub lithographic dimensions. The masks used to define plugs are lithographic in size, and allowances for misalignment of masks increases the required sizes for the access areas.

An example of an integrated circuit pattern comprises a set of lines of material over a substrate, the lines of material defining a pattern of lines having X direction portions and Y direction portions. The lengths of the X direction portions are substantially longer than the lengths of the Y direction portions. The X direction portions have a first pitch and the Y direction portions have a second pitch, the second pitch being larger than the first pitch. The X direction portions are parallel and the Y direction portions are parallel. The Y direction portions comprise end regions. The end regions of the Y direction portions comprise main line portions and offset portions. The offset portions comprise offset elements spaced apart from and electrically connected to the main line portions. The offset portions define contact areas for subsequent pattern transferring procedures.

In some examples, the offset portions are at the end regions. In some examples, the second pitch is at least 3 times larger than the first pitch. In some examples, the lines are lithographically formed lines and the first pitch has a sub lithographic dimension and the second pitch has a lithographic dimension. In some examples, the lines are lithographically formed lines and the contact pickup areas have lithographic dimensions. In some examples, the Y direction portions comprise a continuous loop offset portion contacting the main line portion and located to one side of the main line portion. In some examples, an offset portion is positioned along an associated main line portion and comprises elements extending generally parallel to the associated main line portion and generally perpendicular to the associated main line portion. In some examples, laterally displaced regions are along the main line portions, at least some of the offset portions being located at the laterally displaced regions.

An example of a multiple patterning method, for use during integrated circuit processing procedures, provides contact areas for subsequent pattern transferring procedures and is carried out as follows. A set of parallel line patterns is selected for a set of parallel first lines of material. The set of parallel first lines of material are formed over a substrate, each first line of material defining a pattern having an X direction portion and a Y direction portion. The lengths of the X direction portions of the first lines of material are substantially longer than the lengths of the Y direction portions of the first lines of material. The parallel line patterns selecting step comprises selecting a first pitch for the X direction portions and a second pitch for the Y direction portions with the second pitch being larger than the first pitch, the X direction portions being parallel, and the Y direction portions being parallel. At least two second lines of material are formed parallel to each first line of material to create parallel X direction portions of the second of lines of material and parallel Y direction portions of the second lines of material. The Y direction portions of the second lines of material comprise end regions. The second lines of material forming step comprises forming said Y direction portions with main line portions and offset portions. The offset portions comprise offset elements spaced apart from and electrically connected to the main line portions. The offset portions define contact areas for subsequent pattern transferring procedures.

In some examples, the offset portions are formed at the end regions. In some examples, the Y direction portions forming step comprises forming a continuous loop offset portion contacting the main line portion and located to one side of the main line portion. In some examples, the Y direction portions forming step comprises forming an offset portion comprising at least one offset element extending laterally from the main portion. In some examples, the Y direction portions forming step comprises forming an offset portion positioned along the main line portion and comprising elements extending generally parallel to the main line portion and generally perpendicular to the main line portion. In some examples, the Y direction portions forming step comprises forming laterally displaced regions along the main line portions, with at least some of the offset portions at the laterally displaced regions.

Other features, aspects and advantages of the present invention can be seen on review of the drawings, the detailed description and the claims, which follow.

BRIEF DESCRIPTION OF THE DRAWINGS

FIG. 1 is a top plan view of nested, ring-like lines of material created within a substrate from correspondingly shaped masks, the lines of material having parallel X direction portions and parallel Y direction portions, the pitch between the X direction portions being smaller than the pitch between the Y direction portions.

FIG. 2 shows the creation of spacers on each side of the lines of material of FIG. 1 thereby doubling the line density with a subsequent decrease in the pitch.

FIG. 3 shows the creation of spacers on each side of the lines of material of FIG. 2 thereby quadrupling the line density from that of FIG. 1 with a subsequent decrease in the pitch.

FIG. 4 shows a top plan view of a mask to use with the structure of FIG. 3.

FIG. 5 shows alignment of the mask of FIG. 4 with the structure of FIG. 3 covering parts of the Y direction portions.

FIG. 6 shows the result of removal of the parts of the Y direction portions covered by the mask of FIG. 4 creating end regions for the lines of material.

FIG. 7 is a plan view of a mask to be used with the structure of FIG. 6 to create supplemental features.

FIG. 8 shows results of using the mask of FIG. 7 and appropriate subsequent processing steps, such as exposing and etching, to create supplemental features, specifically contact pads at the end regions along the Y direction portions and bit lines or word lines.

DETAILED DESCRIPTION

Figure 1:
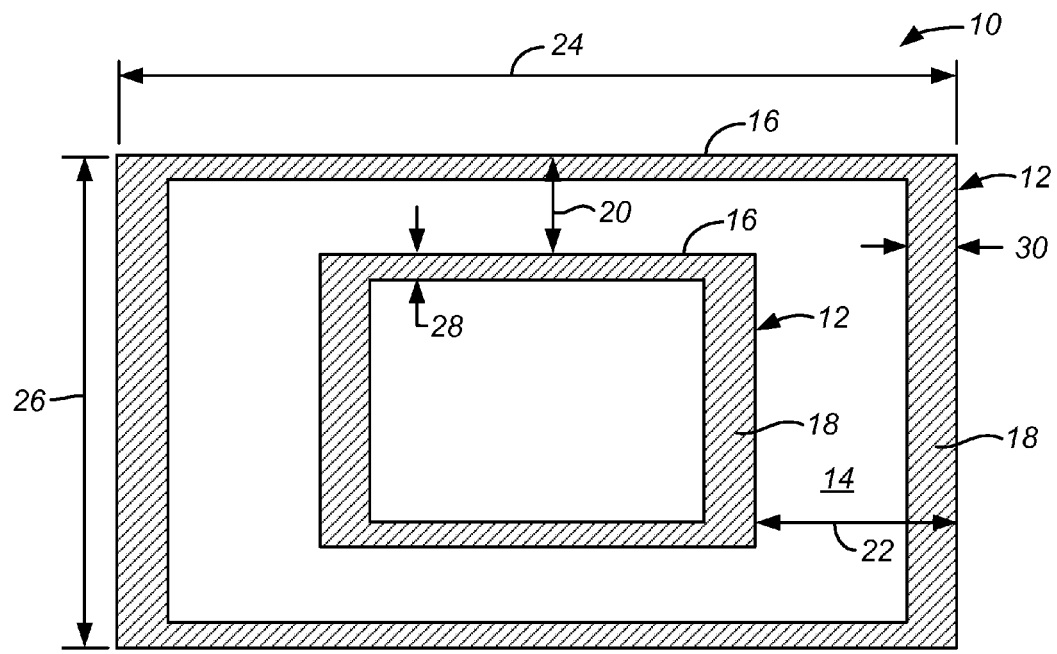
FIGS. 1-8 illustrate, in simplified form, a first example of a quadruple patterning process.

FIGS. 1-33 and the following description relating to those figures are taken from the commonly assigned U.S. patent application Ser. No. 12/981,121 filed on 28 Dec. 2010, entitled Multiple Patterning Method, attorney docket MXIC 1949-1.

It is to be understood and appreciated that the process steps and structures described herein do not describe a complete process flow for the manufacturing of an integrated circuit. The invention may be practiced in conjunction with various integrated circuit fabrication techniques that are conventionally used in the art, or that are hereafter developed.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments and examples are commonly referred to with like reference numerals.

The various examples discussed below typically referred to as using lithography and lithographic procedures, which involves transferring a pattern from one thing to a next, as is typically done during the manufacture of integrated circuits by using a mask and photoresist. However, the invention is not so limited but rather can encompass, for example, procedures for direct writing of patterns on a substrate or other material that might be created in the future using other technologies, such as e-beams. Lithographic procedures and other pattern writing or transferring techniques will sometimes be referred to generically as pattern transferring procedures.

FIGS. 1-8 illustrate, in simplified form, a first example of a quadruple patterning process.

FIG. 1 is a top plan view of a set 10 of nested, ring-like first lines of material 12 created on a substrate 14 from correspondingly shaped masks. The first lines of material 12 have parallel X direction portions 16 and parallel Y direction portions 18. The pitch 20 between the X direction portions 16 is smaller than the pitch 22 between the Y direction portions 18. Pitch 22 is preferably at least 2 times as large as pitch 22, and more preferably at least 3 times as large as pitch 22, and even more preferably at least 4 times as large as pitch 22. The lengths 24 of X direction portions 16 are substantially greater than the lengths 26 of Y direction portions 18, typically orders of magnitude greater, such as at least 30 times greater. However, for purposes of illustration the lengths 24 of X direction portions 16 are not to scale but are greatly reduced. In this example, the width 28 of each X direction portion 16 can need for example about 60 nm and the width 30 of each Y direction portion 18 can be for example about 150 nm. This extra width for Y direction portion 18 can be accommodated because pitch 22 is greater than pitch 20.

Figure 2:
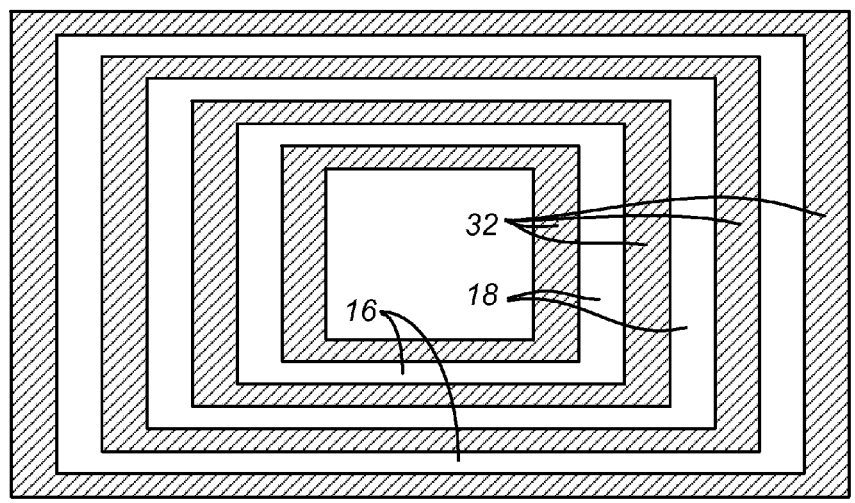

FIG. 2 shows the creation of spacers 32 on each side of the X direction portions 16 and Y direction portions 18 of the first lines of material 12 of FIG. 1. Spacers 32 act as a set of second lines of material 32. This effectively doubles the line density compared with the density of the first lines of material 12 with a consequent decrease in the pitch. In subsequent processing steps X direction portions 16 and Y direction portions 18 of the first lines of material 12 are removed leaving only spacers 32 as the second lines of material.

Figure 3:
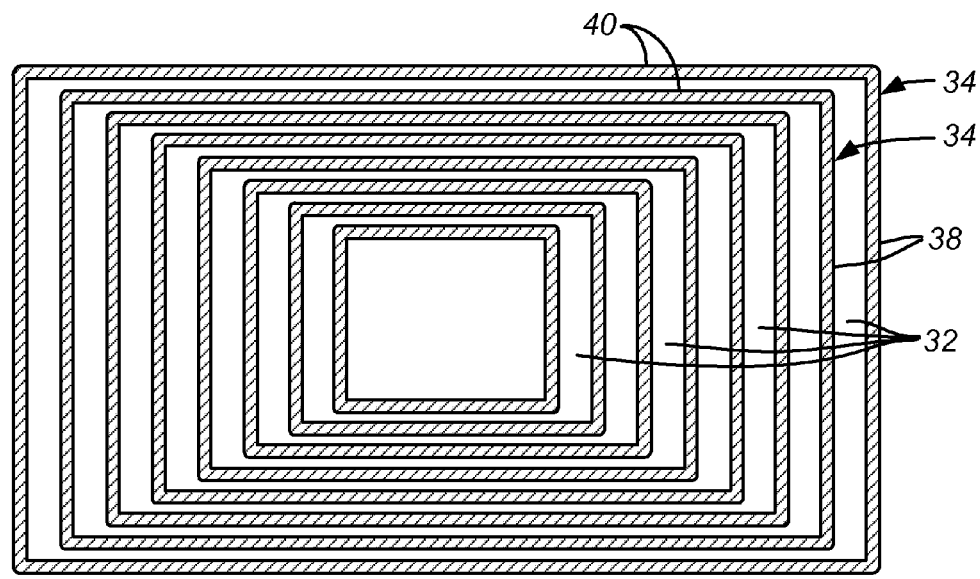

FIG. 3 shows the creation of spacers 34 on each side of the second lines of material 32 of FIG. 2 thereby quadrupling the line density from that of FIG. 1 with a consequent decrease in the pitch. As with portions 16 and 18, second lines of material 32 are removed during subsequent processing steps leaving only spacers 34 as the third lines of material 34.

Figure 4:
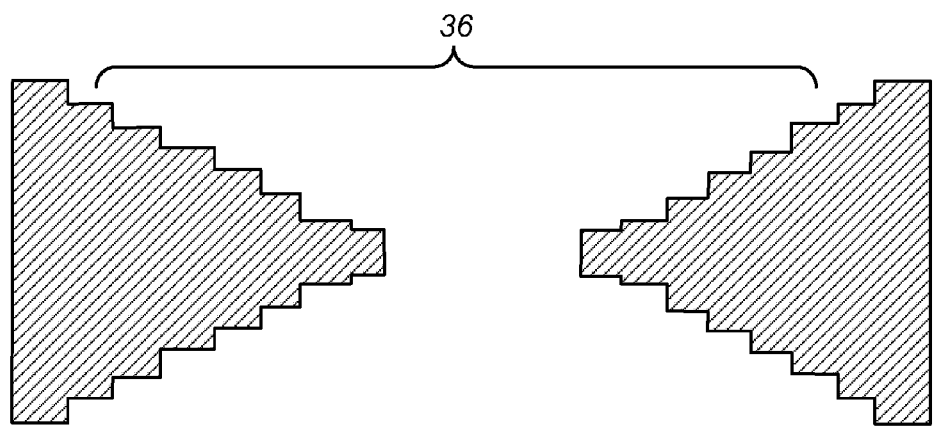
Figure 5:
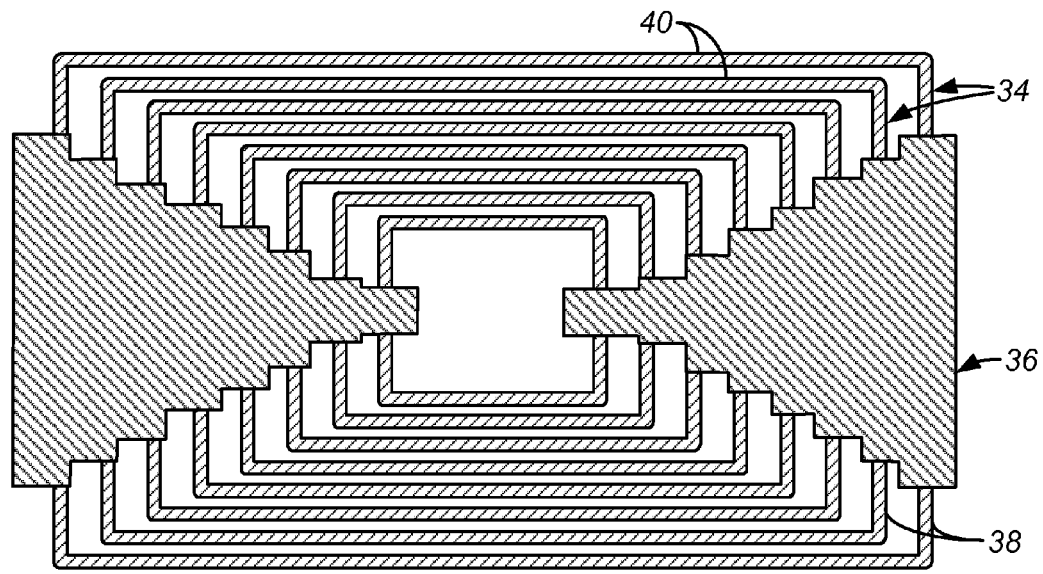

FIG. 4 is a top plan view of a mask 36 to use with the structure of FIG. 3. Mask 36 is used to mask off parts of the Y direction portions 38 of the spacers 34 of FIG. 3; in this example X direction portions 40 are not modified using mask 36 as shown in FIG. 5. Using mask 36 permits the removal of parts of the Y direction portions 38 of spacers 34. The result of this removal, shown in FIG. 6, creates end regions 42 along the Y direction portions 38.

Figure 6:
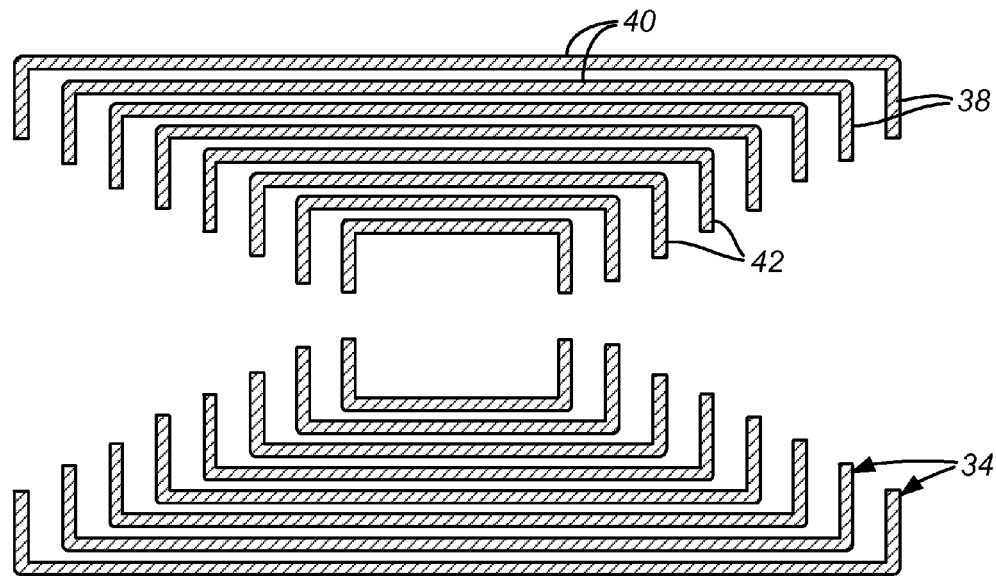
Figure 7:
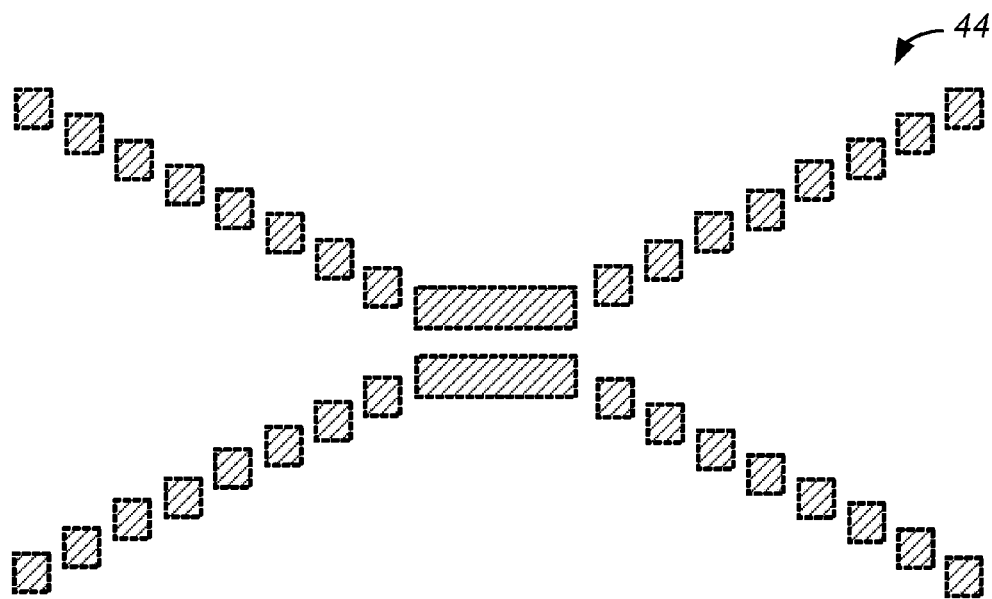
Figure 8:
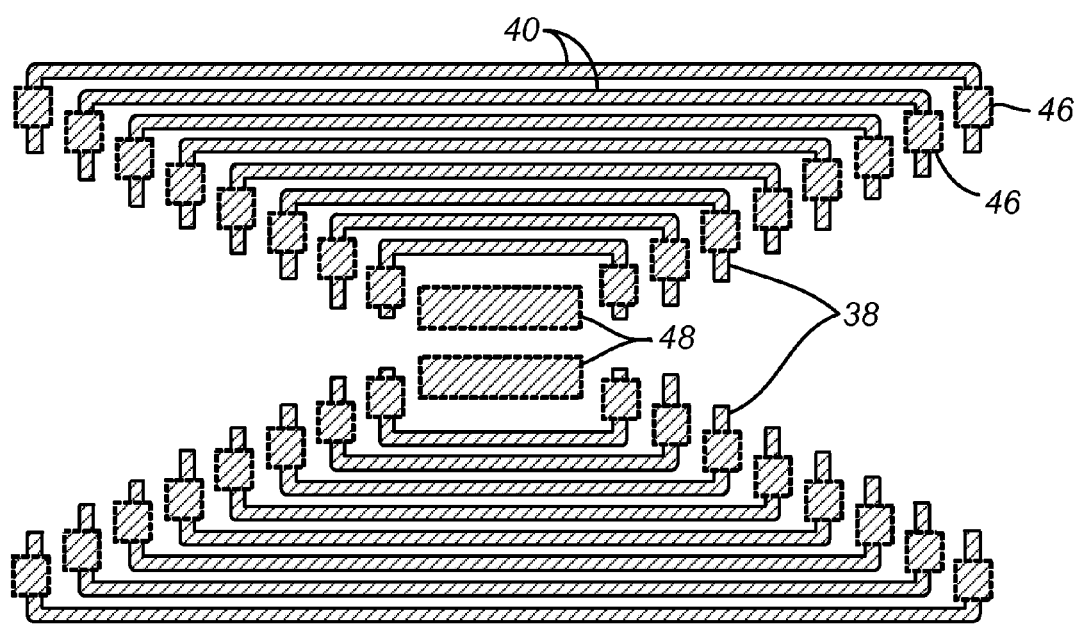
Figure 9:
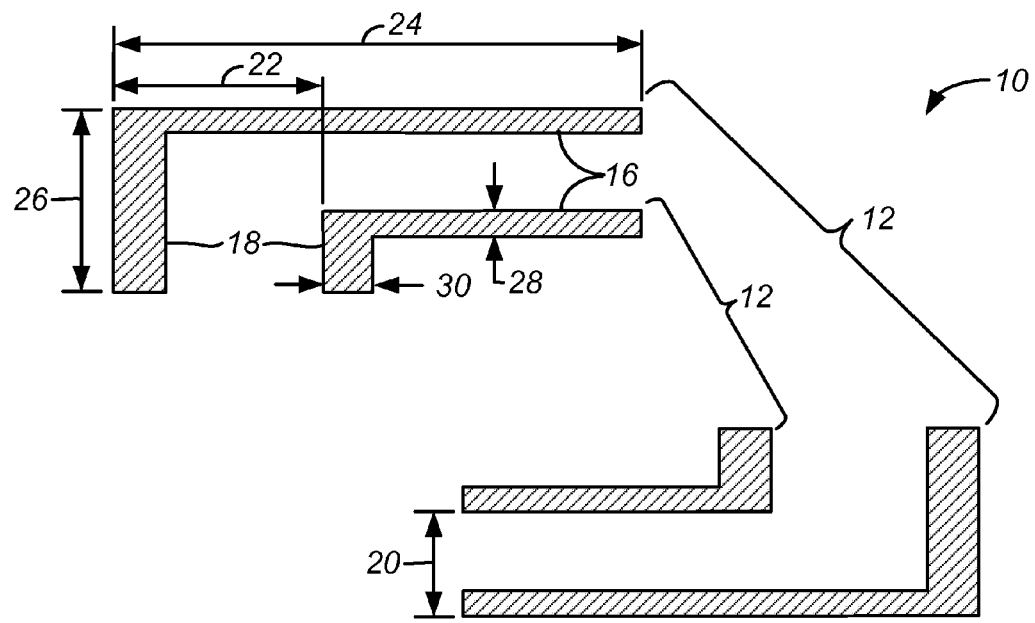
FIGS. 9-16 illustrate, in simplified form, a second example of a quadruple patterning process similar to that of FIGS. 1-8, but in which the nested, ring-like lines of material are in the form of L-shaped segments.
Figure 10:
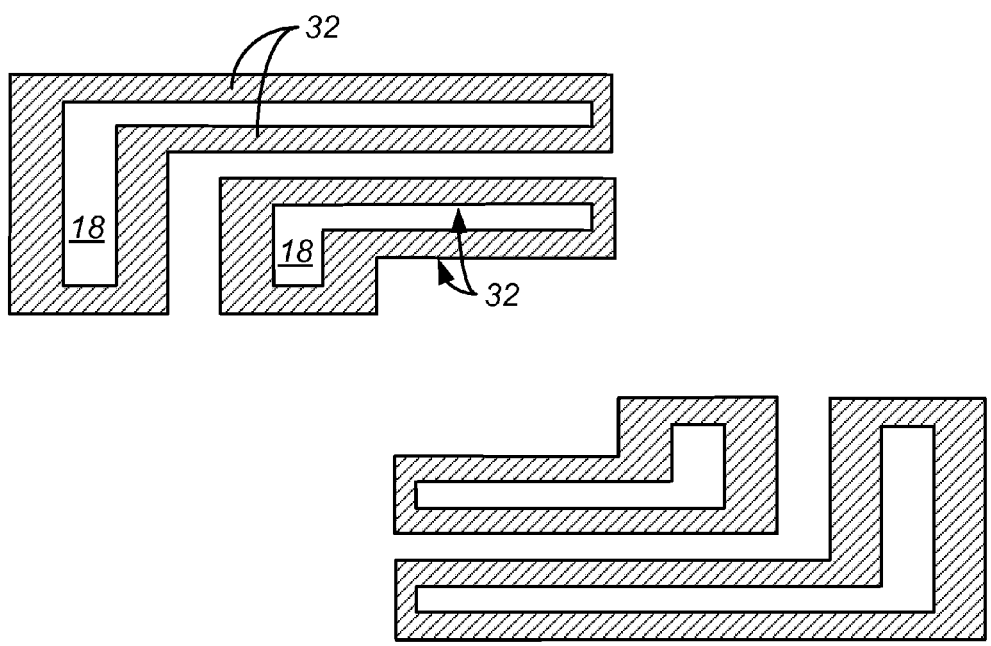
Figure 11:
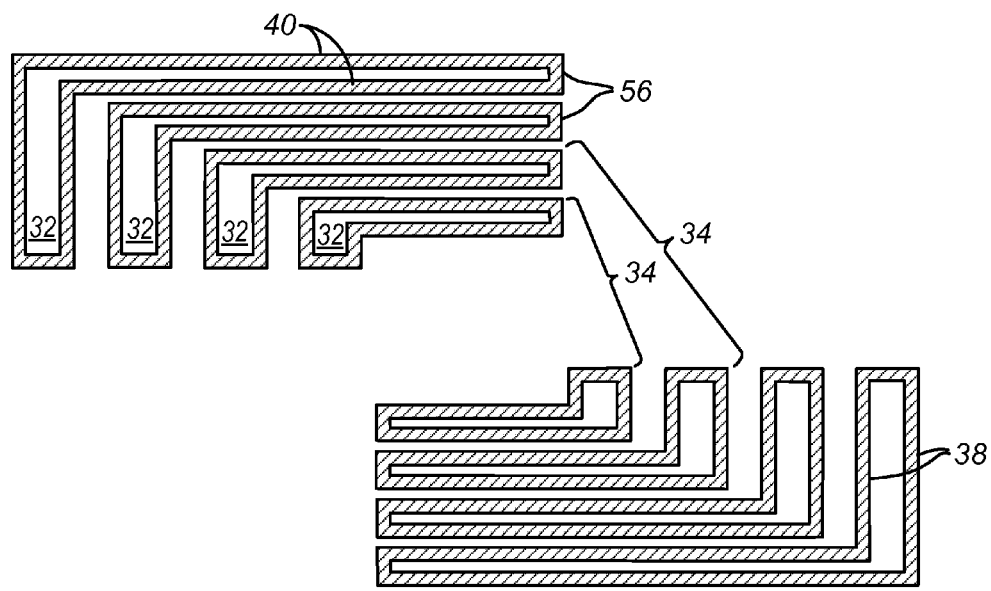

FIG. 7 is a plan view of a mask 44 to be used with the structure of FIG. 6 to create supplemental features. In this example, the supplemental features include contact pads, to be applied at end regions 42 of Y direction portions 38, and circuit interconnect lines. FIG. 8 shows results of using mask 44 and appropriate subsequent processing steps, such as exposing and etching steps, to create supplemental features, specifically contact pads 46 at the end regions 42 along the Y direction portions 38, and circuit interconnect lines 48. The pitch of Y direction portions 38 is preferably sufficient for lithographically sized pads and alignment tolerances while the pitch of the X direction portions 40 are not constrained by these issues and therefore can be sub lithographic.

The increased pitch between end regions 42 of Y direction portions 38, when compared to the pitch of X direction portions 40, is important because it can permit the use of conventional, lithographically sized contact pads 46 or larger pads formed in other ways to provide electrical access to the sub lithographically sized and spaced X direction portions 40 of the third lines of material 34. The third lines of material 34 typically act as word lines or bit lines so that X direction portions 40 and Y direction portions 38 are typically X directed word/bit line portions 40 and Y directed word/bit line portions 38, respectively. By providing sufficient space between the innermost X direction portions 40 of the lines of material 34, the circuit interconnect lines 48 can be placed between the innermost X direction portions as shown in FIG. 8. In other examples, circuit interconnect lines 48 can be positioned outside of the outermost X direction portions 40 of the lines of material 34. Circuit interconnect lines 48 can be lithographically sized or sub lithographically sized lines.

Figure 12:
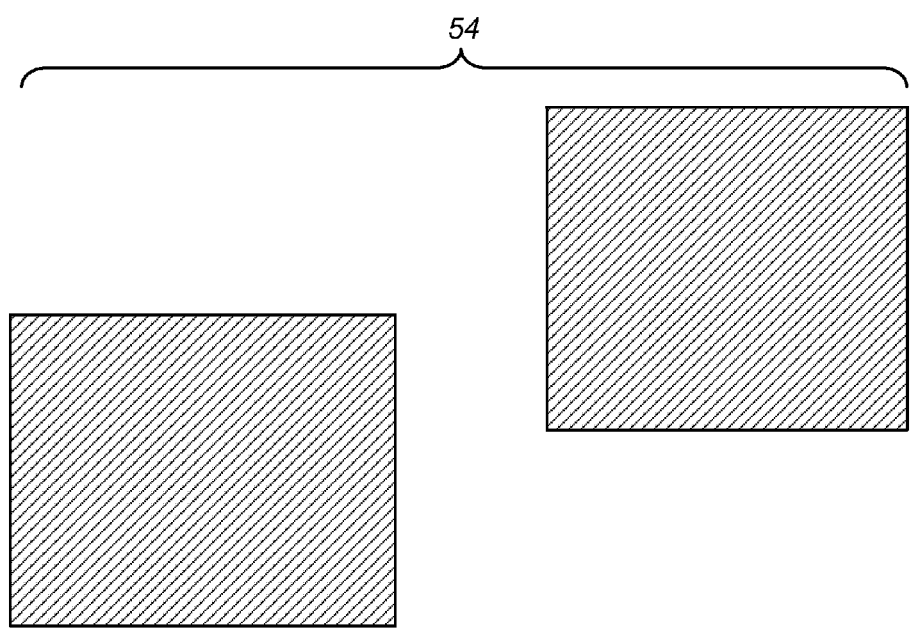
Figure 13:
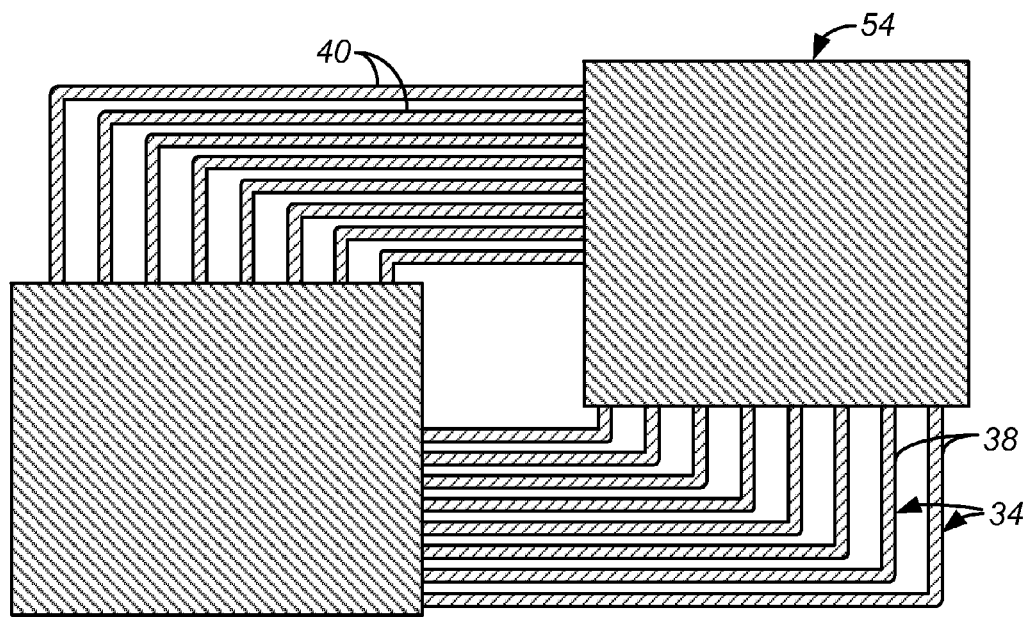
Figure 14:
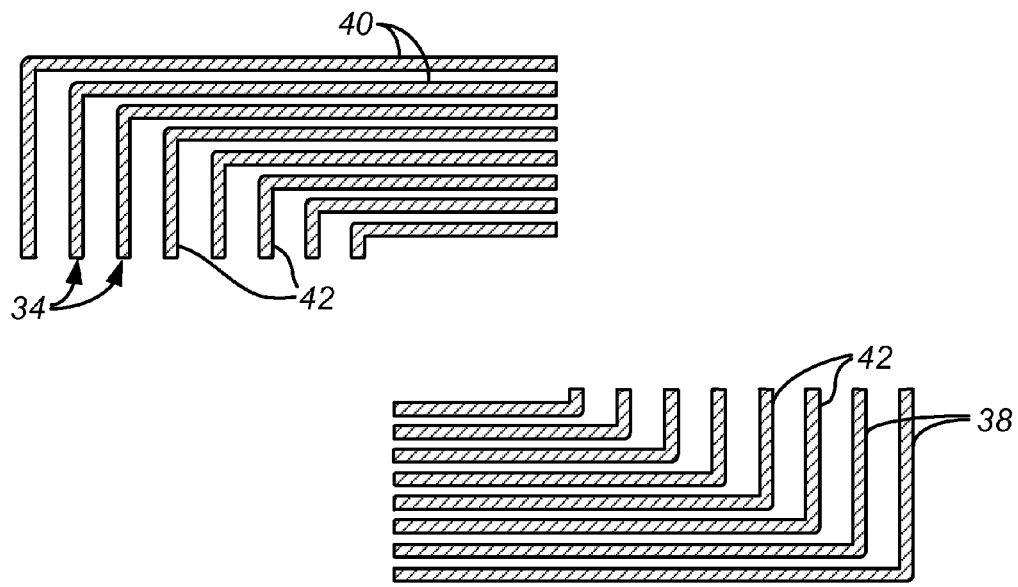
Figure 15:
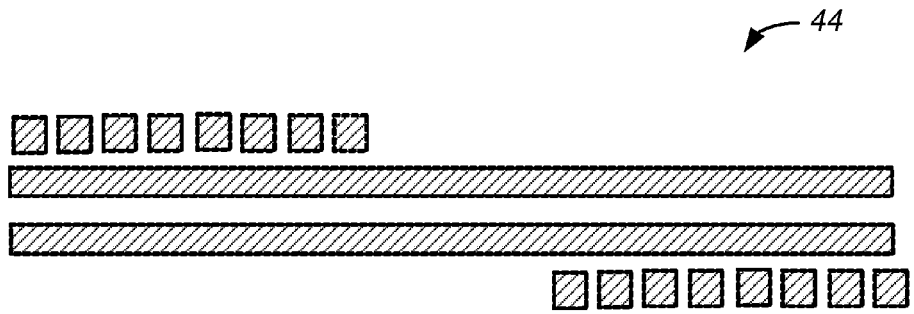
Figure 16:
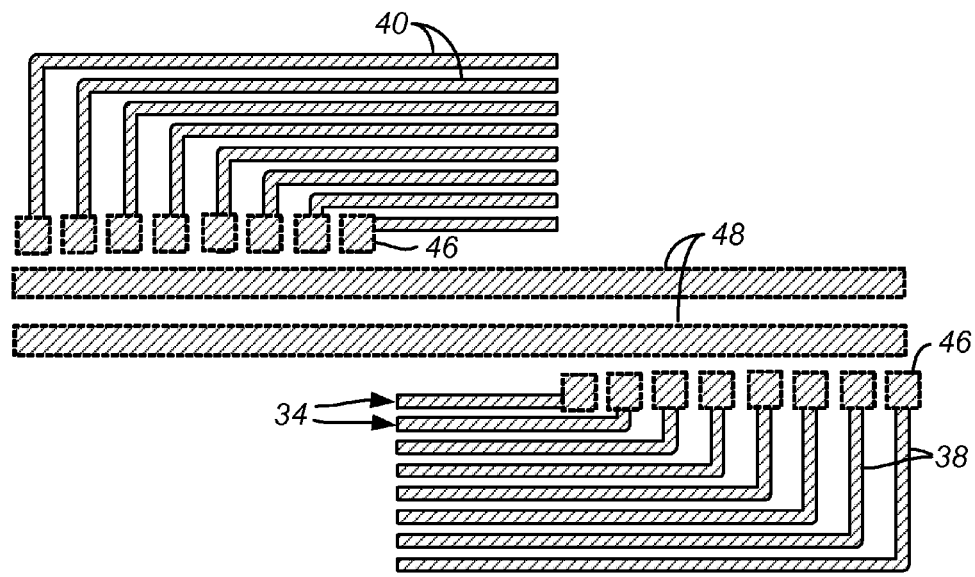

FIGS. 9-16 illustrate, in simplified form, a second example of a quadruple patterning process similar to that of FIGS. 1-8. Therefore, this second example will not be described in detail. However, the primary distinctions are as follows. The set 10 of nested, ring-like lines of material 12 are in the form of L-shaped segments 52. Therefore, pairs L-shaped segments 52 create the nested, ring like lines of material. Mask 54 of FIG. 12 is sized to cover not only parts of Y direction portions 38 but also parts of X direction portions 40, see FIG. 13, so that adjacent spacers 34 are not electrically connected to one another by the end elements 56 shown in FIG. 11.

Figure 17A:
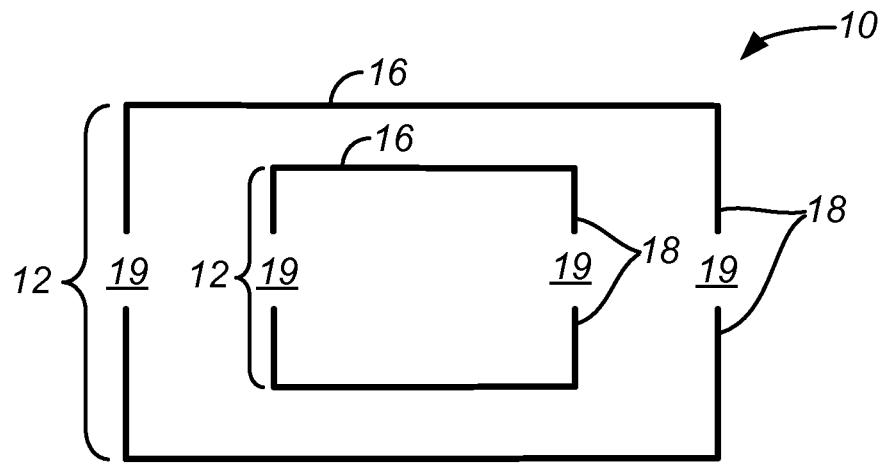
FIGS. 17A-17C show three additional examples of sets of nested, ring like lines of material.
Figure 17B:
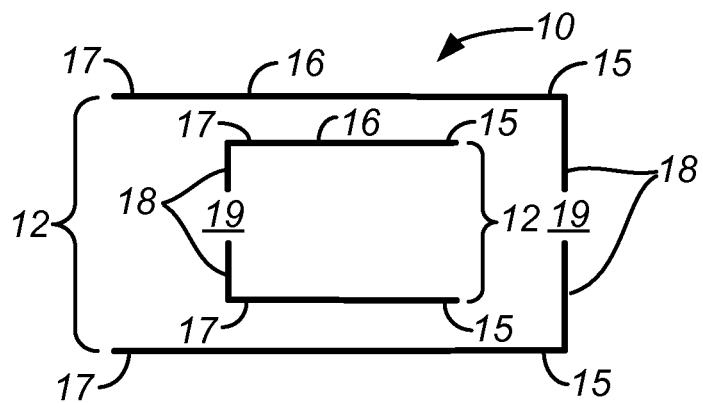
Figure 17C:
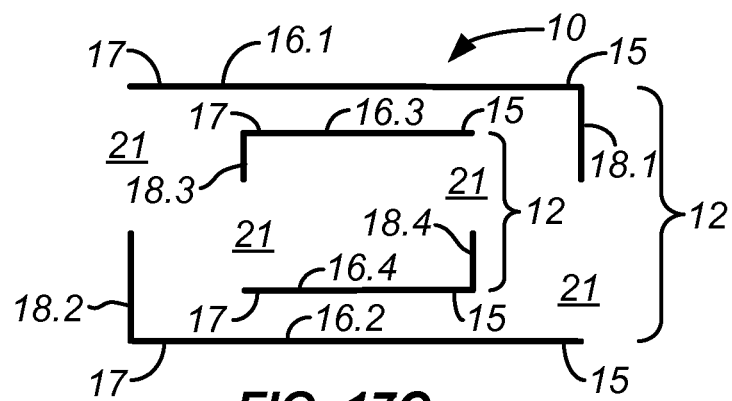

FIGS. 17A-17C show three additional examples of sets 10 of nested, ring like lines of material 12. Contact pads will be formed at positions 55 along the Y direction portions 56.

Figure 18:
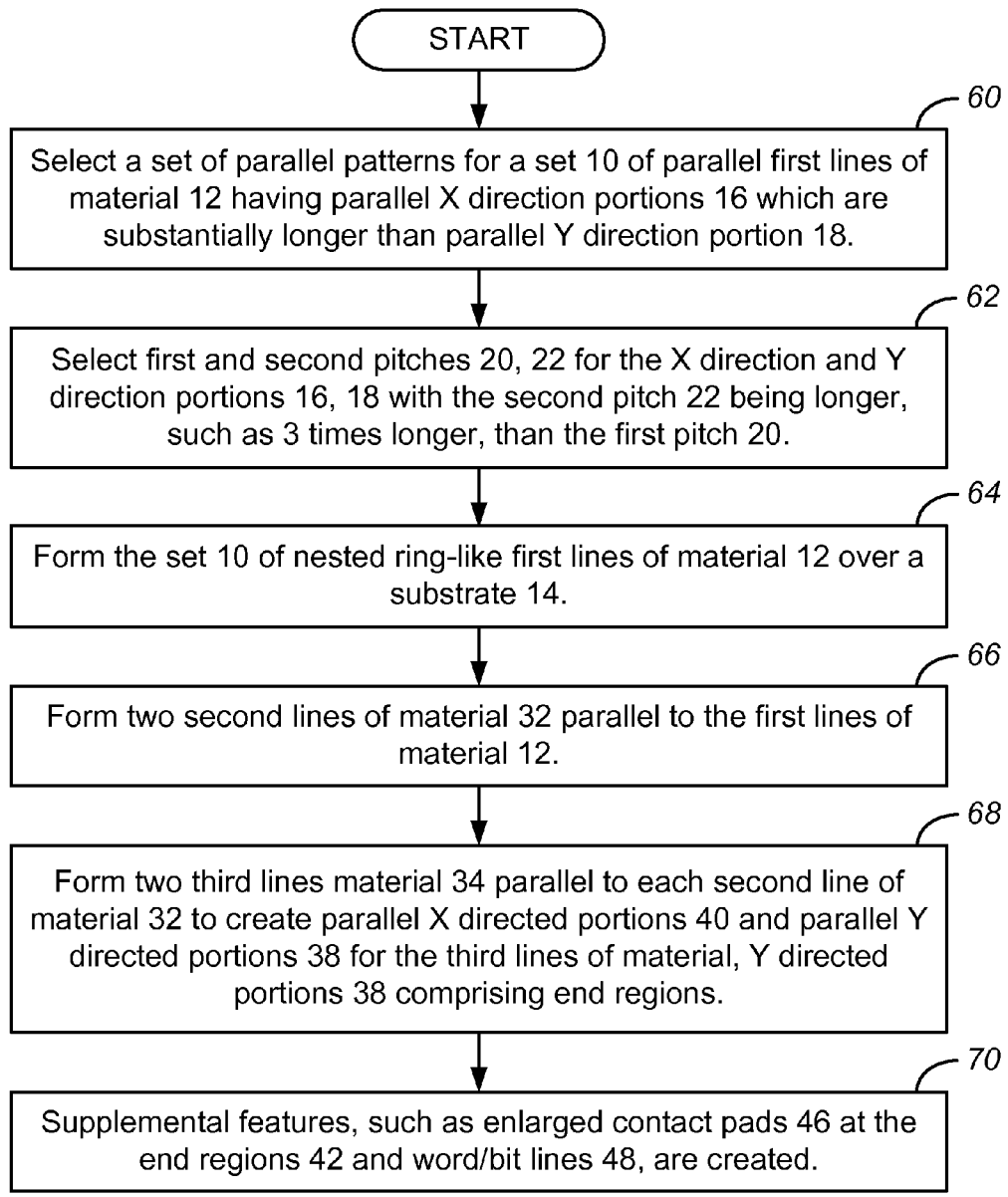
FIG. 18 is a simplified flow diagram showing the basic procedures carried out in the multiple patterning method of the present invention discussed above with reference to FIGS. 1-17.

FIG. 18 is a simplified flow diagram showing the basic procedures carried out in the multiple patterning method of the present invention. Starting at 68, a set of parallel line patterns, typically nested ring-like patterns, for a set 10 of parallel first lines of material 12 is selected. First lines of material 12 have parallel X direction portions 16 which can be substantially longer than parallel Y direction portions 18, such as 100 or 1000 times as long. Next, at 62, the first and second pitches 20, 22 for the X direction and Y direction portions 16, 18 are selected. The pitches are selected such that the second pitch 22 is larger, such as 4-8 times larger, than the first pitch 20. At 64 the set 10 of parallel first lines of material 12 is formed over a substrate 14. Two second lines of material 32 are formed at 66. The second lines of material 32 are parallel to the first lines of material 12. Two third lines material 34 are formed parallel to each second line of material 32 at 68. Doing so creates parallel X direction portions 40 and parallel Y direction portions 38 for the third lines of material. The Y direction portions 38 of the second lines of material 34 comprise end regions 42. At 70 supplemental features, such as enlarged contact pads 46 at the end regions 42 and circuit interconnect lines 48, are created.

Figure 19:
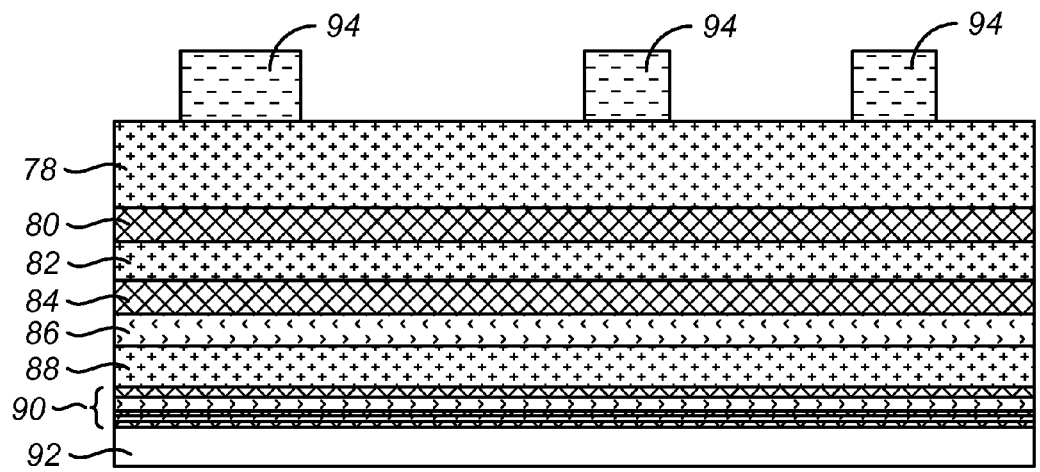
FIGS. 19-32 show the process flow for one example using BESNOS WL quadruple patterning.

FIGS. 19-32 show the process flow for one example using BE-SONOS WL quadruple, self-aligned spacer patterning, BE-SONOS referring to charge trapping memory cell. FIG. 19 shows a substrate 76 including first through eighth layers 78-92 and a photo resist trace 94 formed on first layer 78. In this example, first, third and sixth layers 78, 82 and 88 are made of polycrystalline silicon, commonly referred to as poly, while a second and fourth layers 80 and 84 are made of $SiO_2$. Sixth layer 86 is made of WSi. The eighth layer 92 is Si. The seventh layer 90 is a composite of five layers, acting as charge storage structure for BE-SONOS, having alternating $SiO_2$ and SiN layers with the $SiO_2$ layers being the first, third and fifth layers counting from the top. The first, second and third layers 78, 80 and 82 are considered sacrificial layers because they are completely removed in the patterning process. Other materials and arrangements of materials may also be used.

Figure 20:
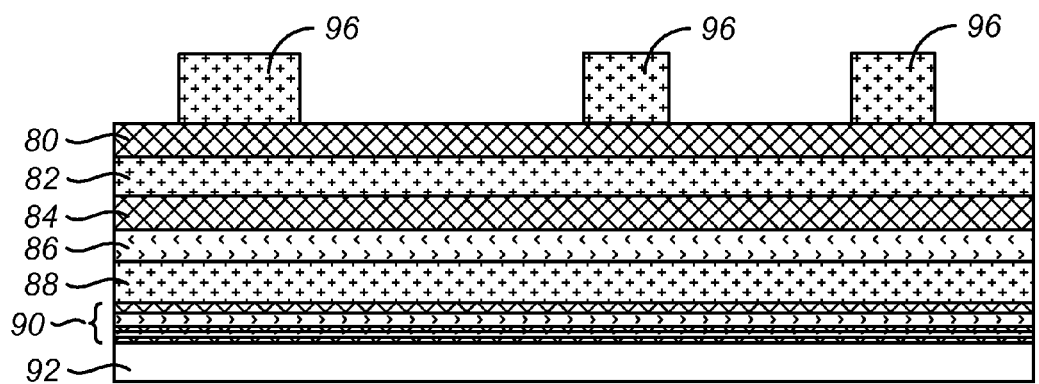
Figure 21:
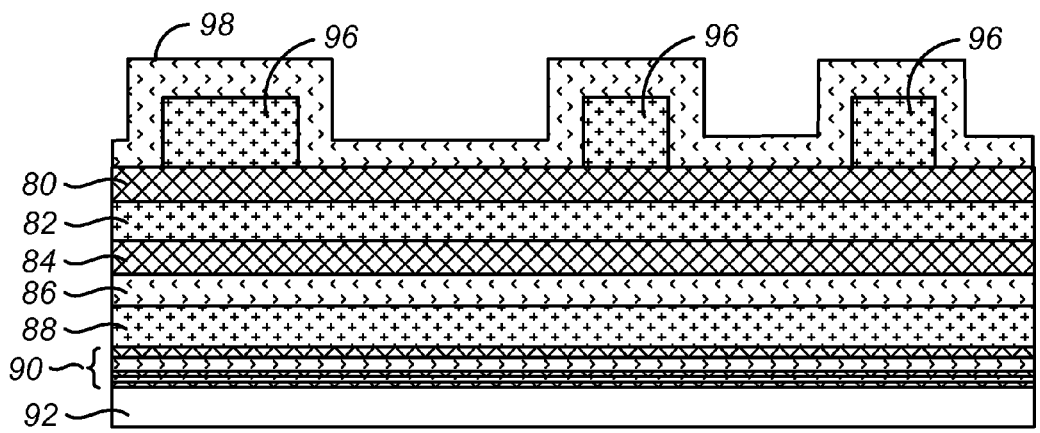
Figure 22:
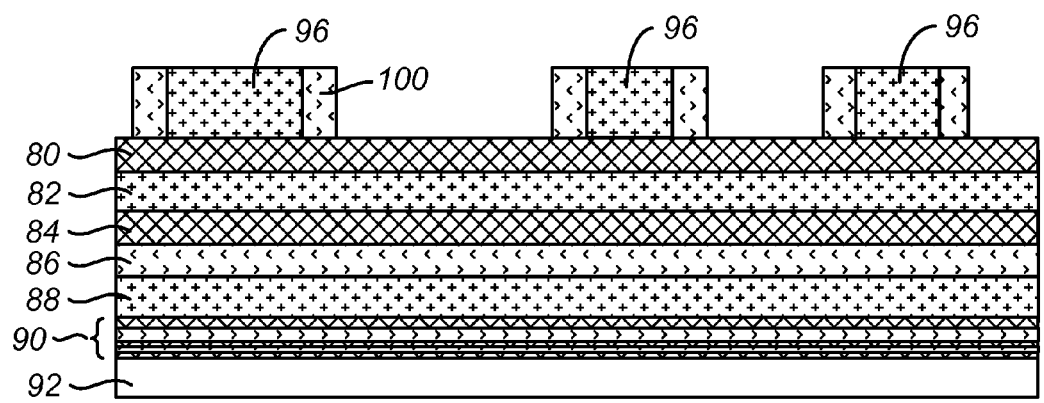
Figure 23:
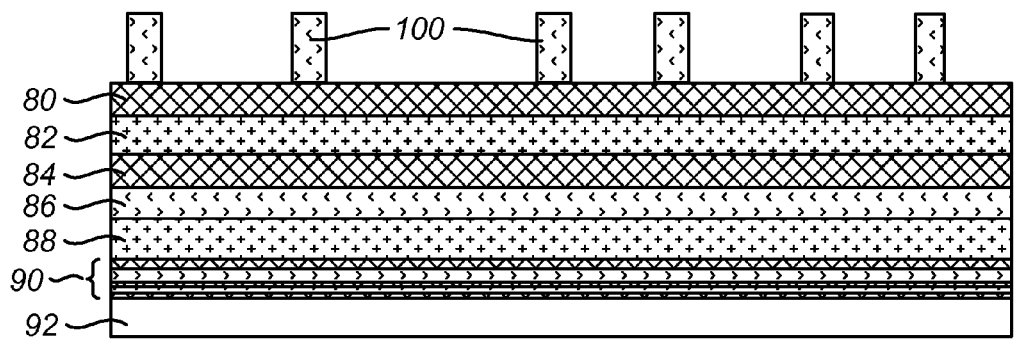
Figure 24:
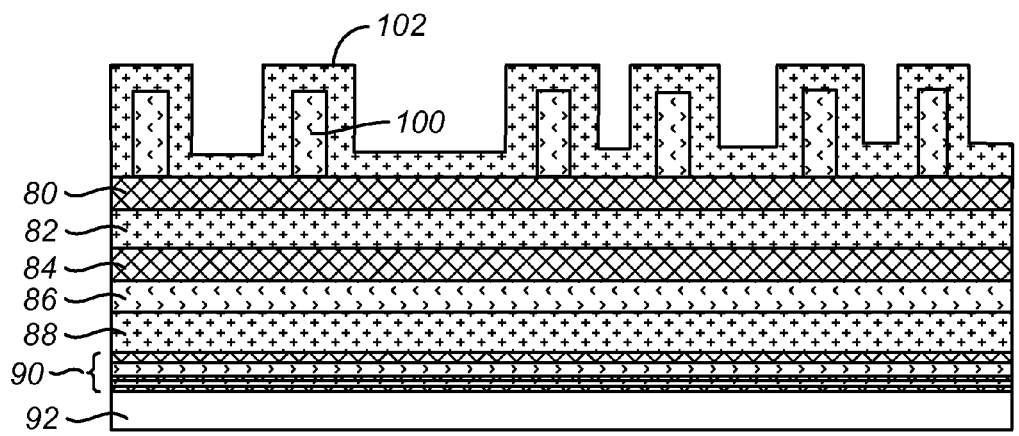
Figure 25:
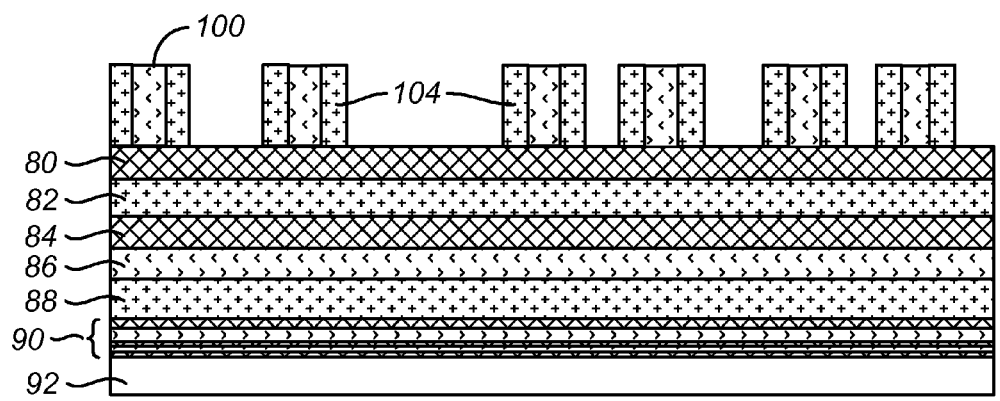

Photo resist trace 94 is used to etch first layer 78 to create structure 96, see FIG. 20, corresponding to the first line of material 12 of FIG. 1. FIG. 21 shows the results of depositing a layer 98 of SiN over the structure of FIG. 20. FIG. 22 shows the results of anisotropic etching the layer 98, which removes those portions of layer 98 covering structure 96 in addition to layer 80. Doing so leaves sidewall spacers 100 on each side of structure 96 with the sidewall spacers corresponding to spacers 32 of FIG. 2. FIG. 23 shows results of etching structure 96 leaving sidewall spacers 100. FIG. 24 shows the structure of FIG. 23 after a film 102 of poly has been deposited thereon. In FIG. 25 the portions of film 102 above sidewall spacers 100 and covering second layer 80 are removed leaving poly sidewall spacers 104 on each side of SiN sidewall spacers 100.

Figure 26:
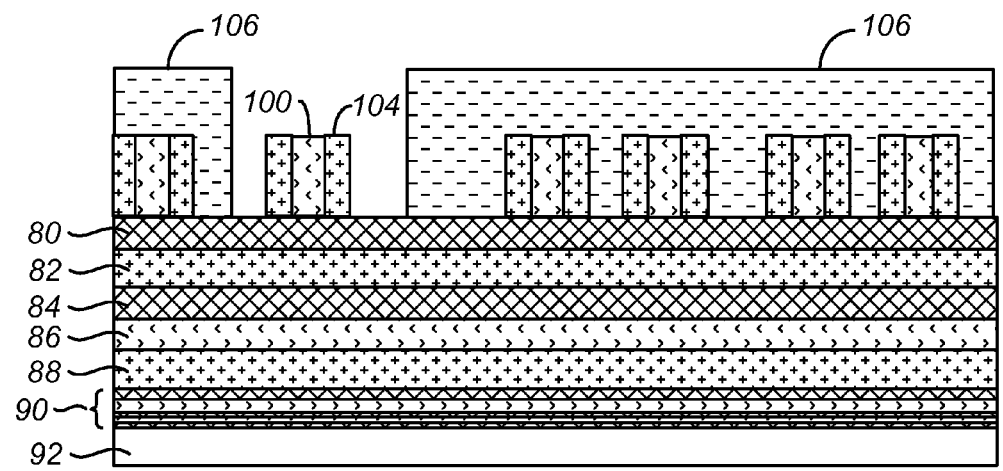
Figure 27:
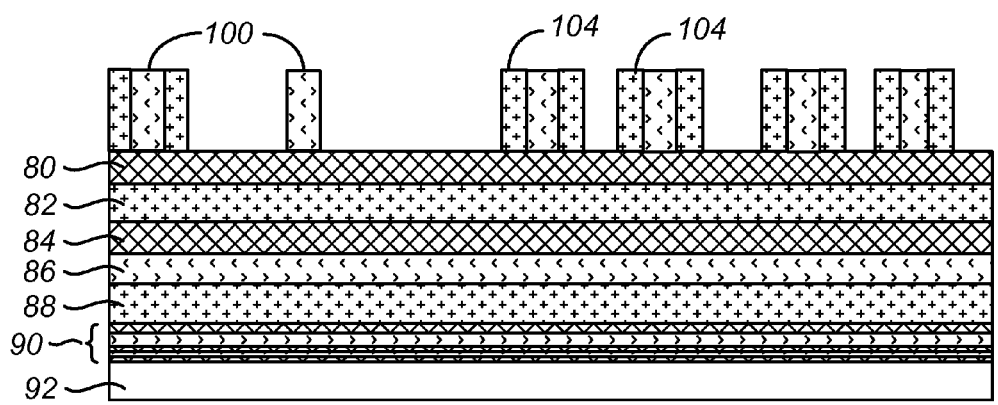
Figure 28:
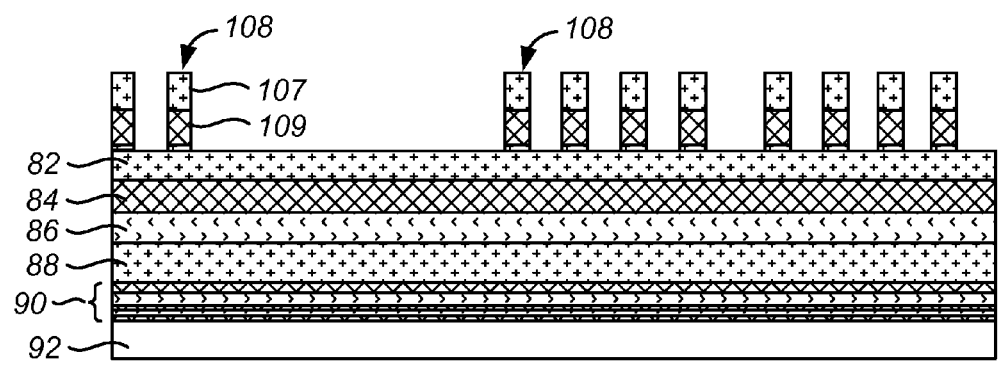

In FIG. 26 a photo resist mask 106 is used to cover portions of the structure of FIG. 25 that are not to be removed. Mask 106 can be considered to be the inverse of mask 36 of FIG. 4. FIG. 27 shows results of removing the poly sidewall spacers 104 not protected by photo resist mask 106 and the subsequent removal of photo resist mask 106. FIG. 28 shows the result of etching SiN sidewall spacers 100 and those portions of second layer 80 not covered by sidewall spacers 104; doing so leaves poly/$SiO_2$ stacks 108 on the third layer 82. Stacks 108 include upper, poly portions 107 and lower, SiO$_2$ portions 109. The comparing the two structures 96 on the right-hand side of the structure of FIG. 20 to the poly/SiO$_2$ stacks 108 on the right-hand side of the structure of FIG. 28, it can be seen that the number of vertical structures has quadrupled from 2 to 8.

Figure 29:
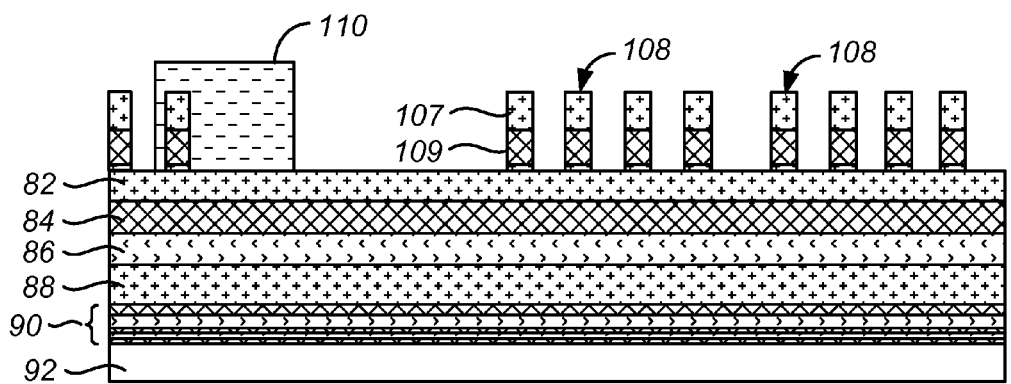
Figure 30:
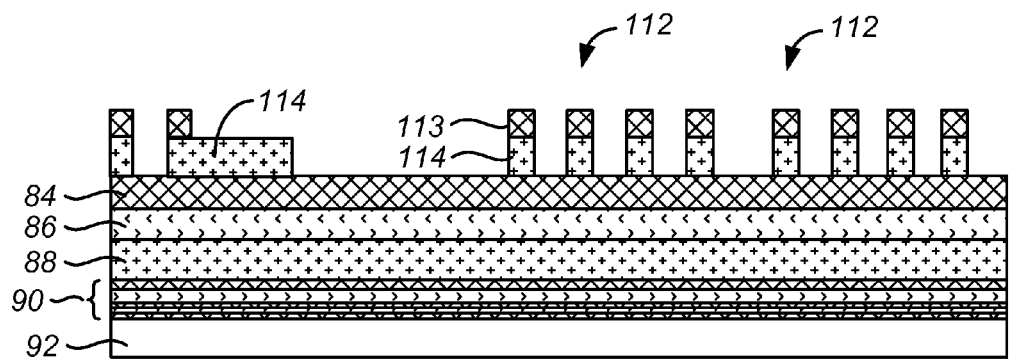
Figure 31:
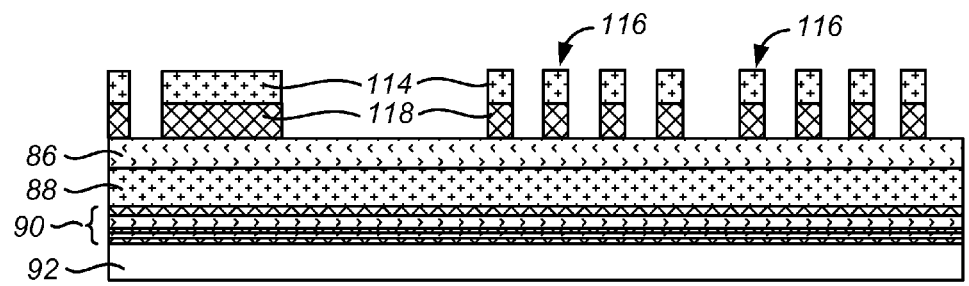

FIG. 29 shows a photo resist mask 110 on the structure of FIG. 28, mask 110 generally corresponding to mask 44 of FIG. 7. FIG. 30 shows the structure of FIG. 29 after those portions of third layer 82 not covered by stacks 108 or mask 110 have been etched. The upper, poly portions 107 are removed leaving stacks 112. Stacks 112 include an upper, SiO$_2$ portion 113 and a lower, poly portion 114. In FIG. 30 photo resist mask 110 has also been removed. FIG. 31 shows results of an oxide etch, which removes the upper, SiO$_2$ portions 113 and any portions of fourth, SiO$_2$ layer 84 not covered by poly portions 114, which creates stacks 116. Stacks 116 include poly portion 114 and SiO$_2$ portion 118.

Figure 32:
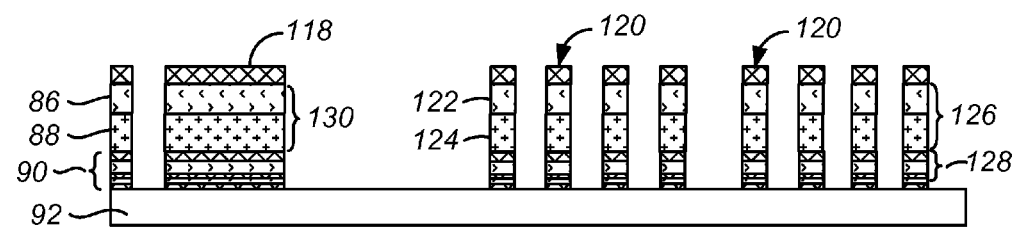

FIG. 32 shows results of etching of those portions of layers 86, 88 and 90 not covered by stacks 116, the removal of poly portion 114 and the partial removal of SiO$_2$ portion 118 leaving a row of memory cells 120 with etched elements 122, 124, typically of WSi and poly respectively, together constituting rows of word lines 124, word lines 124 located above charge storage regions 128. In this example, memory cells 120 form a NAND string. This will etching procedure also creates, in this example, a string select line 130 extending in the same direction as word lines 124. Part of SiO$_2$ portion 118 can remain after the entire seventh layer 90 is etched through because the thickness of fourth layers 84 is typically much greater than seventh layer 90.

Figure 33:
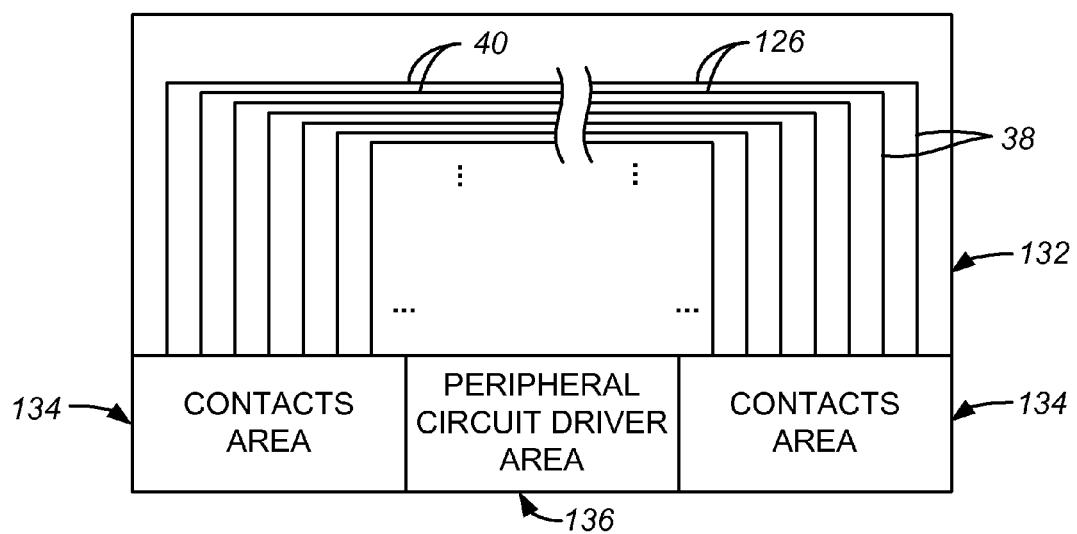
FIG. 33 is a block diagram schematically illustrating the relationship between the word lines region, the contacts areas and the peripheral circuit driver area.

FIG. 33 is a block diagram illustrating the closely spaced X directed word line portions 40 and the more widely spaced Y directed word line portions 38 in a word lines region 132. There would typically be thousands of word lines 124 in a typical memory circuit. In this example, two different contacts areas 134 are provided adjacent to and coupled to word lines region 132. The contacts 46 are located within contacts areas 134 along the more widely spaced (larger pitch) Y directed word line portions 38. A peripheral circuit driver area 136 is located between and coupled to contacts areas 134. This type of arrangement in which (1) the word lines are in a word lines region 132, (2) the word lines region 132 if one or more contacts areas 134 containing contacts 46 along Y directed word line portions 38, and (3) one or more associated peripheral circuit driver areas 136 contact areas 134, provides an efficient layout of integrated circuit real estate for high density memory.

The following discussion of FIGS. 34-55 will describe various examples of modifications to the above described methods and structures for creating contact areas at the Y direction portions. The examples of FIGS. 34-51 use double patterning methods with the understanding that quadruple patterning, used with the example of FIGS. 52-55, or greater patterning can also be used.

Figure 34:
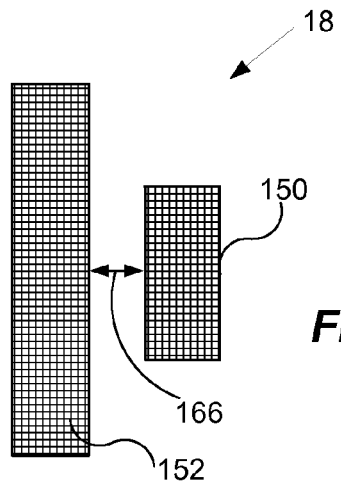
FIGS. 34-36 illustrate the creation of an offset portion of a Y direction portion using an I shaped design in a double patterning process, the offset portion including an offset element and element connecting the offset element to the main line portion.
Figure 35:
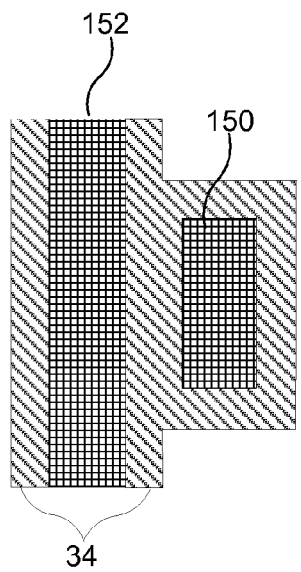
Figure 36:
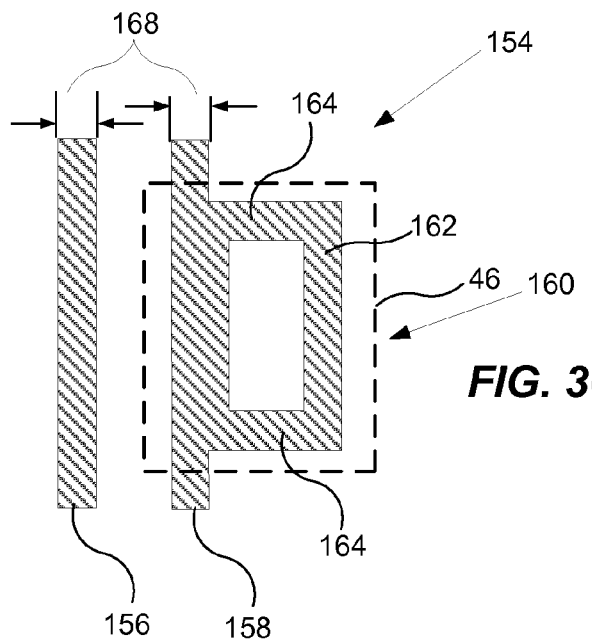

FIG. 34 illustrates a Y direction portion 18 and including a relatively short Y direction portion segment 150 adjacent to a main Y direction portion segment 152. Segment 150 is sometimes referred to as an island segment 150. FIG. 35 illustrates the formation of conductive spacers 34 on either side of segment 152 and surrounding segment 150. FIG. 36 illustrates the structure of FIG. 35 after the removal of segments 150, 152 leaving a Y direction portion 154 including main line portions 156, 158 and offset portion 160. Offset portion 160 includes an offset element 162 spaced apart from and generally parallel to main line portion 158 and connecting elements 164 electrically connecting offset element 162 to main line portion 158. Y direction portion 154 creates a contact area 46 for subsequent lithograph procedures. The distance 166 between Y direction portion segments 150, 152 is preferably greater than the width 168 of main line portions 156, 158. Distance 166 is also preferably less than three times the width 168. This type of pattern is sometimes referred to as an I shaped design for double patterning because of the I-shape of island segment 150.

Figure 37:
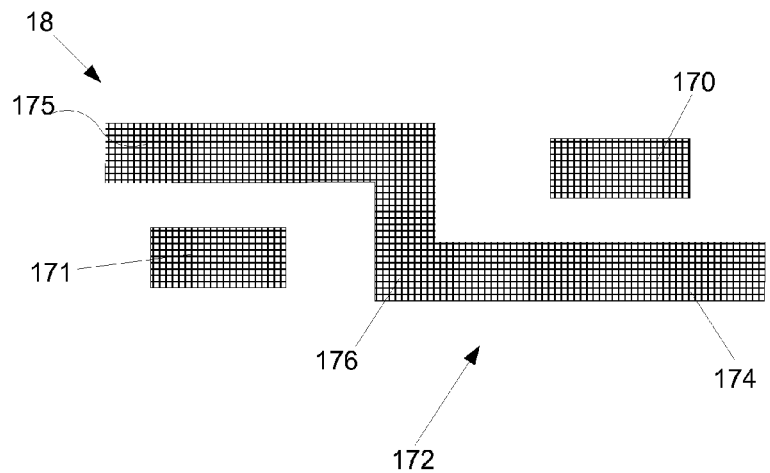
FIGS. 37-39 illustrates a process similar to that of FIGS. 34-36 but using a double I shaped design in a double patterning process.
Figure 38:
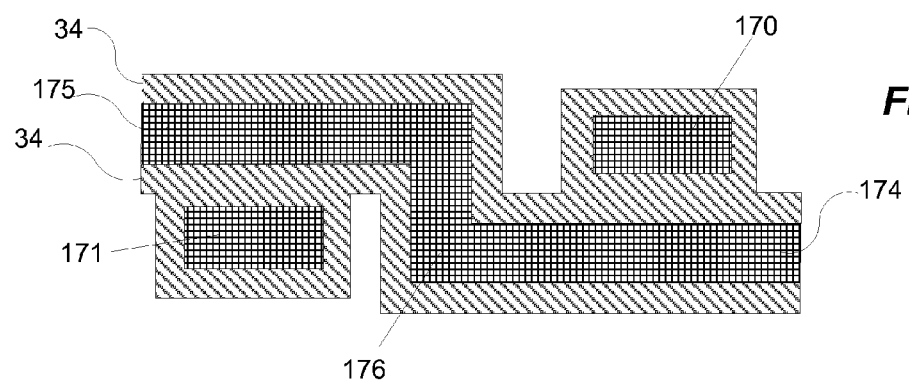
Figure 39:
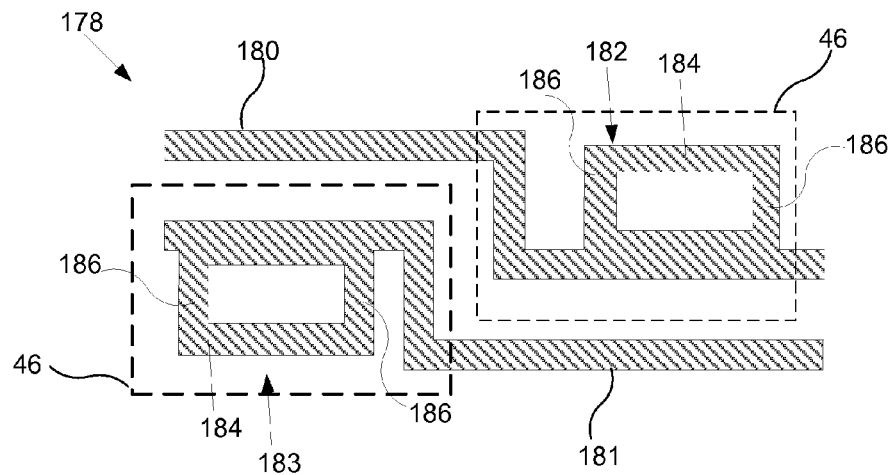

FIGS. 37-39 relate to a double I shaped design for double patterning. Y direction portion 18 includes Y direction portion segments 170, 171 positioned adjacent to a main Y direction portion segment 172. Main Y direction portion segment 172 has first and second laterally displaced regions 174, 175 connected by a connection region 176. FIG. 38 illustrates the formation of conductive spacers 34 on either side of segment 172 and surrounding island segments 170, 171. FIG. 39 illustrates the structure of FIG. 38 after the removal of segments 170, 171 and 172 leaving a Y direction portion 178 including main line portions 180, 181 and offset portions 182, 183. Offset portions 182, 183 each includes an offset element 184, spaced apart from and generally parallel to main line portions 180, 181, and connecting elements 186, electrically connecting offset element 184 to its respective main line portion 180, 181. Y direction portion 178 creates a contact area 46 for subsequent lithograph procedures.

Figure 40:
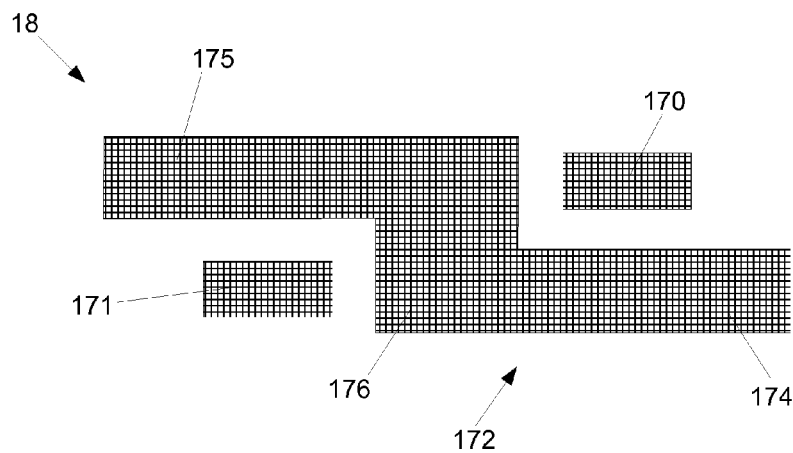
FIGS. 40-42 illustrate a process similar to that of FIGS. 37-39.
Figure 41:
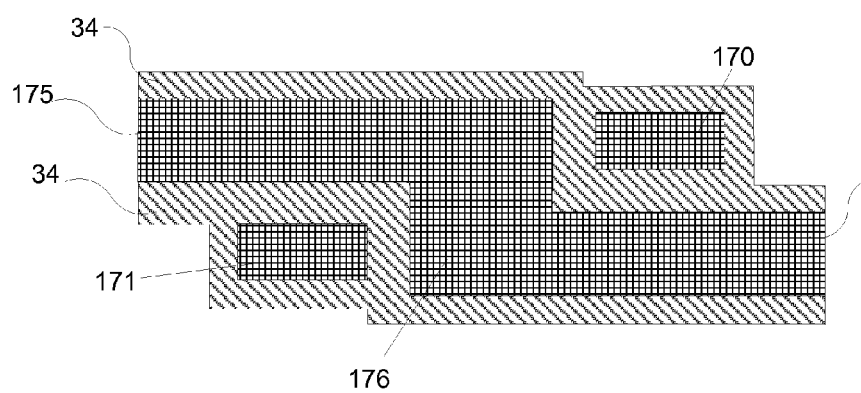
Figure 42:
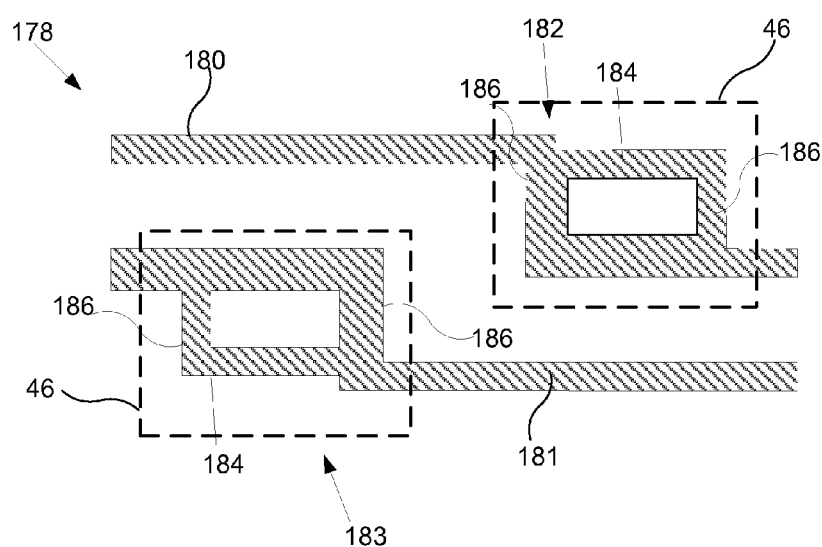

FIGS. 40-42 show an alternative to the example of FIGS. 37-39 with like elements referred to with like reference numerals.

Figure 43:
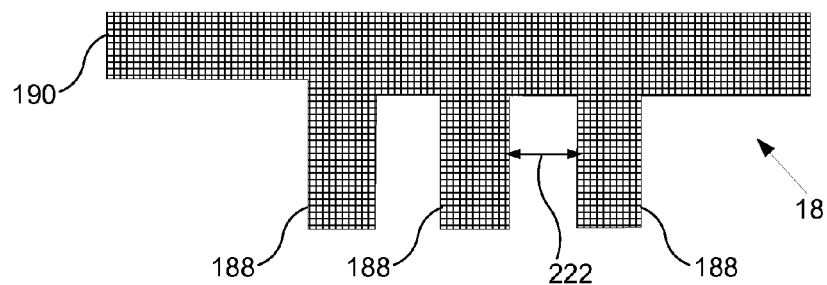
FIGS. 43-45 illustrate a process similar to that of FIGS. 34-36 but using an E shaped design in a double patterning process.
Figure 44:
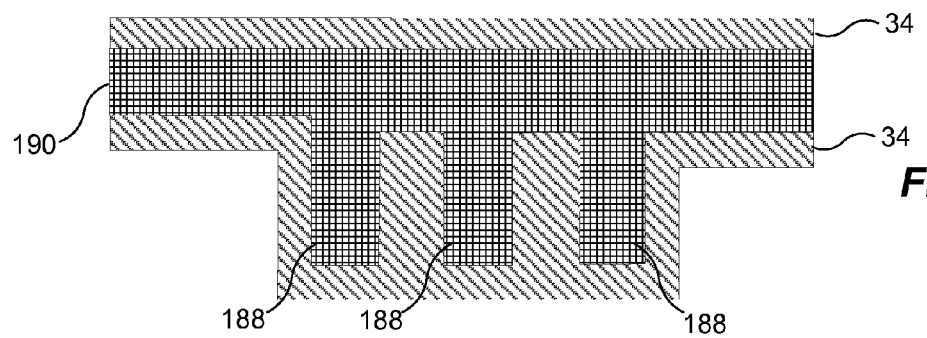
Figure 45:
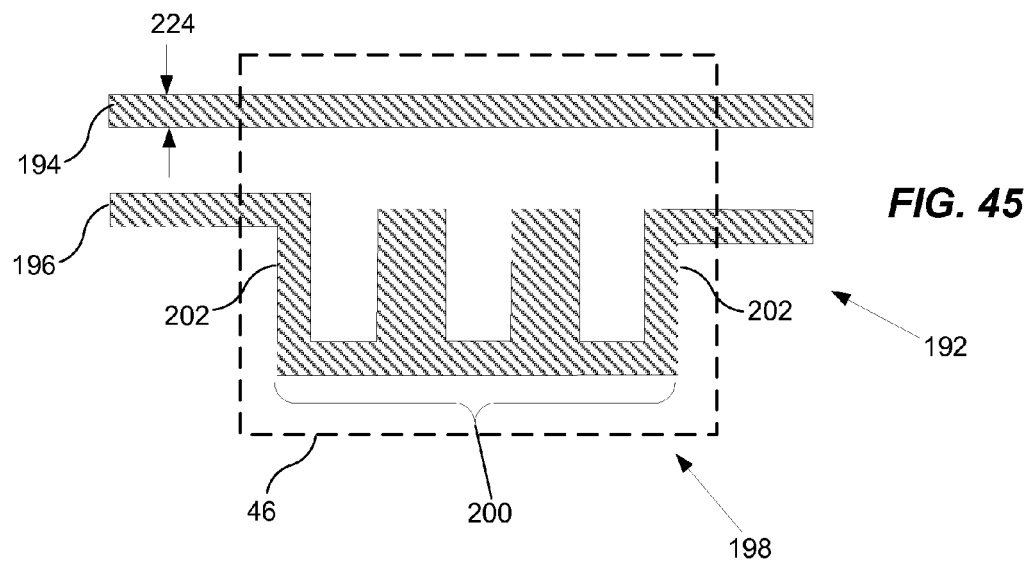

FIGS. 43-45 relate to an E shaped design for double patterning. FIG. 43 illustrates a Y direction portion 18 including three relatively short, laterally directed segments 188 extending laterally from and generally perpendicular to a main segment 190. FIG. 44 illustrates the formation of conductive spacers 34 on either side of segment 190 and surrounding segments 188. FIG. 45 illustrates the structure of FIG. 44 after the removal of segments 188, 190 leaving a Y direction portion 192 including main line portions 194, 196 and offset portion 198. Offset portion 198 includes an offset element 200 spaced apart from and generally parallel to main line portion 196 and connecting elements 202 electrically connecting offset element 200 to main line portion 196. Y direction portion 192 creates a contact area 46 for subsequent lithograph procedures. In this example, contact area 46 includes offset portion 198 and parts of both of main line portions 194, 196; in other examples, contact area 46 may not include a part of main line portion 194. The distance 222 between Y direction portion segments 188 is preferably greater than or equal to the width 224 of main line portions 194, 196. Distance 222 is also preferably less than 4 times the width 224. These dimensions are typical with similar designs, such as those shown in FIGS. 46-49 and 49-51.

Figure 46:
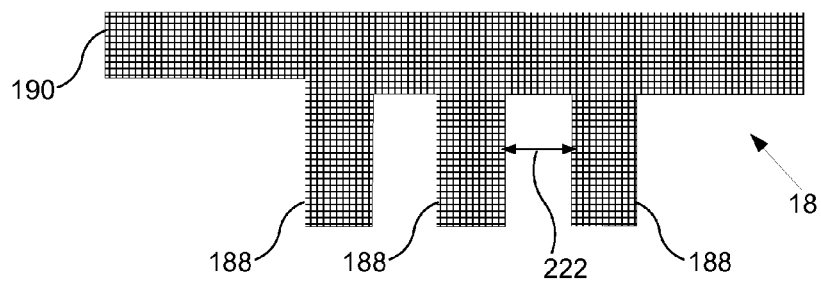
FIGS. 46-48 illustrate a process similar to that of FIGS. 43-45.
Figure 47:
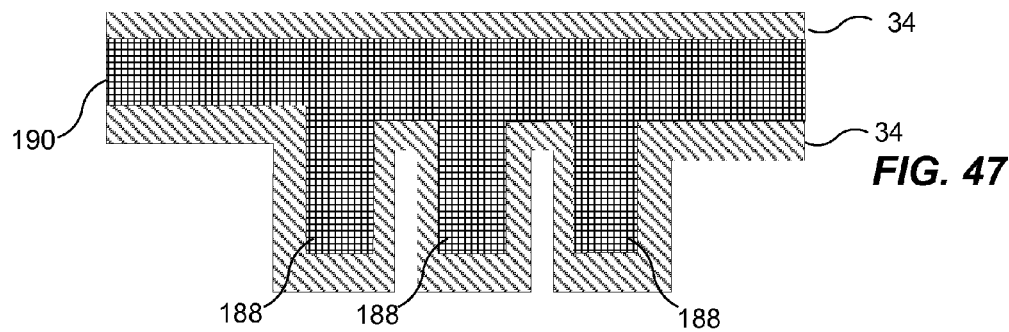
Figure 48:
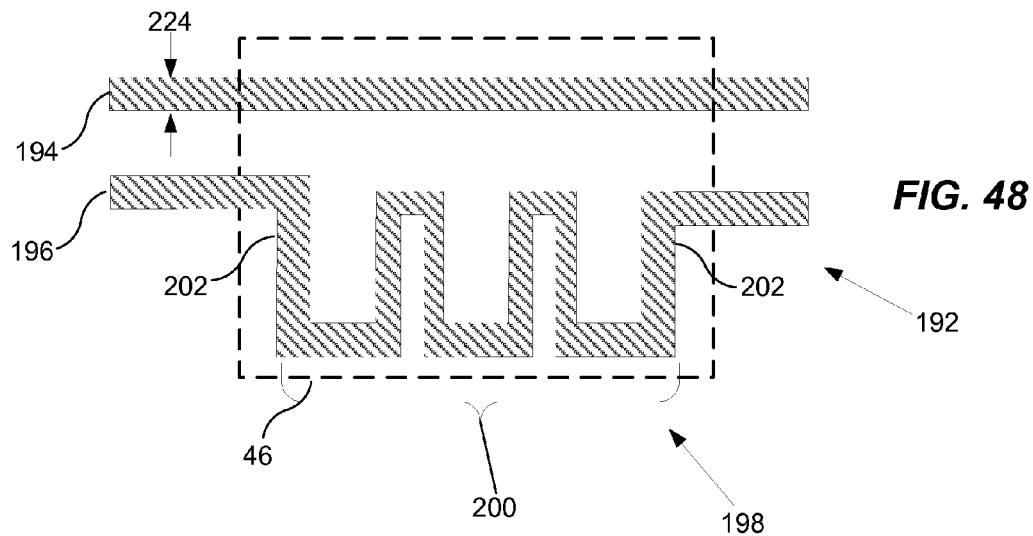

FIGS. 46-48 show an alternative to the example of FIGS. 43-45 with like elements referred to with like reference numerals.

Figure 49:
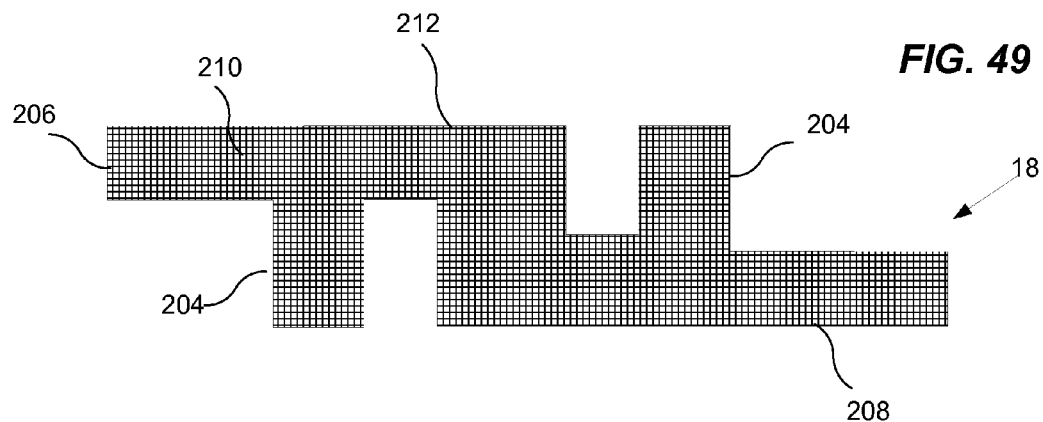
FIGS. 49-51 illustrate a process similar to that of FIGS. 34-36 but using a double F shaped design in a double patterning process.
Figure 50:
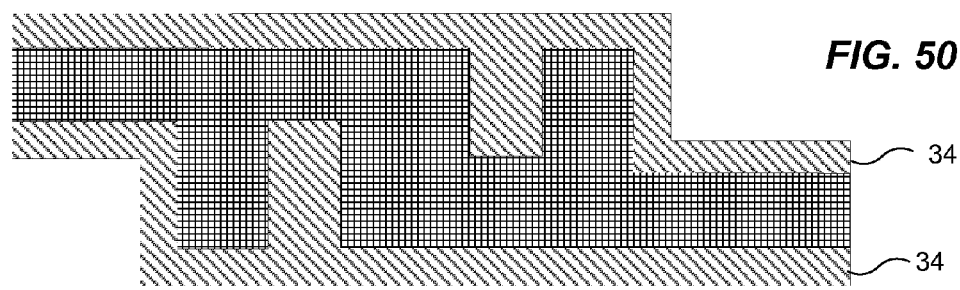
Figure 51:
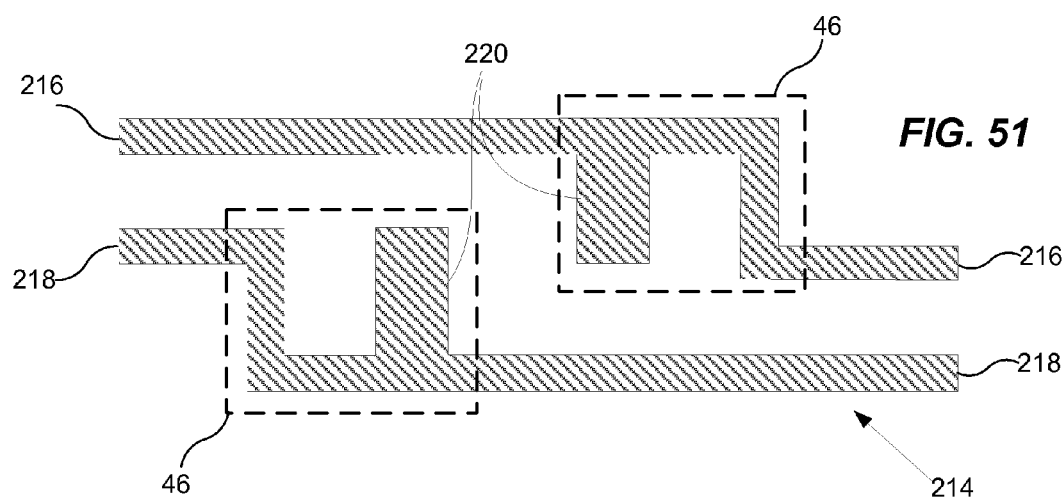

FIGS. 49-51 relate to a double F shaped design for double patterning. FIG. 49 illustrates a Y direction portion 18 including a main segment 206 having first and second laterally displaced regions 208, 210 connected by a connection region 212. Portion 18 also includes two relatively short, laterally directed segments 204 extend laterally from and generally perpendicular to main segment 206. FIG. 50 illustrates the formation of conductive spacers 34 on either side of segment 206 and surrounding segments 204. FIG. 51 illustrates the structure of FIG. 47 after the removal of segments 204, 206 leaving a Y direction portion 214 including main line portions 216, 218 and offset portions 220 extending laterally from main line portions 216, 218. Offset portions 198 are electrically connected to main line portions 216, 218. Y direction portion 214 creates a contact area 46 associated with each of main line portions toward 16, 218 for subsequent lithograph procedures.

Figure 52:
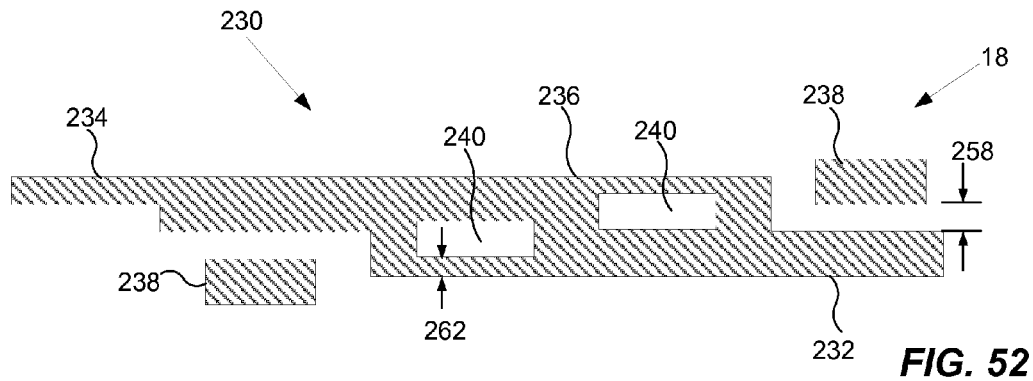
FIGS. 52-55 illustrate a process similar to that of FIGS. 37-39 but using a double P design in a quadruple patterning process.
Figure 53:
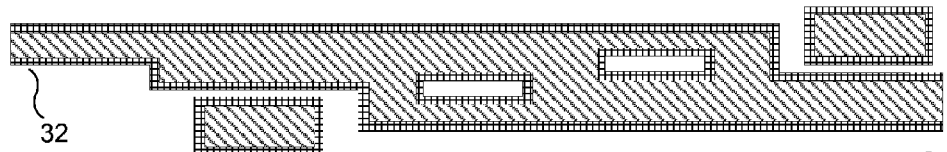
Figure 54:
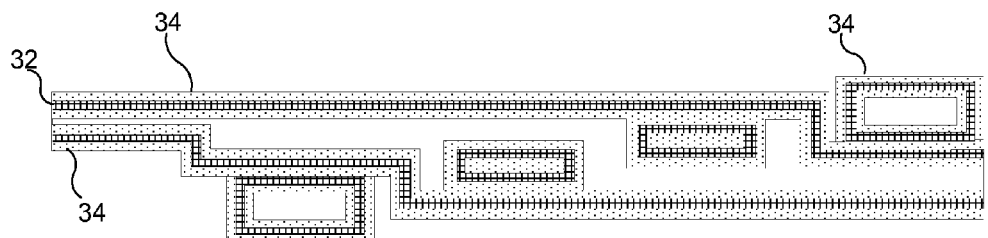
Figure 55:
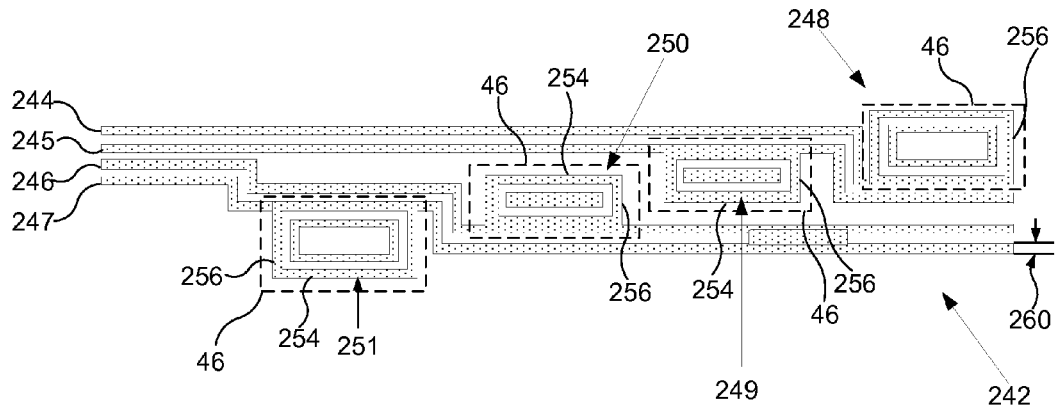

FIGS. 52-55 relate to a double P shaped design for quadruple patterning. FIG. 52 illustrates a Y direction portion 18 including a main segment 230 having first and second laterally displaced regions 232, 234 connected by a connection region 236. Portion 18 also includes two relatively short island segments 238 spaced apart from main segment 206. Voids 240 are formed in connection region 236. FIG. 53 illustrates the structure of FIG. 52 after formation of spacers 32 along the edges of Y direction portion 18. FIG. 54 illustrates the formation of conductive spacers 34 along the edges of spacers 32 following the removal of Y direction portion 18. FIG. 55 illustrates the structure of FIG. 54 after the removal of spacers 32 leaving a Y direction portion 242 including main line portions 244, 245, 246, 247 and offset portions 248, 249, 250, 251 extending laterally from their associated main line portions. Each offset portion 248-251 includes an offset element 254 electrically connected to its associated main line portion by connecting elements 256. Y direction portion 242 creates a set of four contact areas 46 for subsequent lithograph procedures. Within each offset portion is an electrically conductive element which is not necessarily electrically connected to any other structure but does help provide mechanical stability to the resulting contact area 46. The distance 258 between island segment 238 and region 232 of main segment 230 is preferably greater than or equal to twice the width 260 of main line portions 244-247 and is preferably less than or equal to five times the width 260 of main line portions 244-247. Dimension 262 is preferably greater than or equal to the width 260 of main line portions 244-247 and is preferably less than or equal to three times the width 260 of main line portions 244-247.

The invention discussed above with reference to FIGS. 34-55 can be used for general semiconductor devices, including memory and logic devices, to create various features such as gates in addition to the metallization patterns discussed above. The invention is also applicable with various integrated circuit processing techniques, including shallow trench isolation.

Any and all patents, patent applications and printed publications referred to above are incorporated by reference.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit pattern comprising:
a set of lines of material over a substrate, the lines of material defining a pattern of lines having X direction portions and Y direction portions, the lengths of the X direction portions being substantially longer than the lengths of the Y direction portions;
the X direction portions having a first pitch and the Y direction portions having a second pitch, each of the second pitches being larger than the first pitch;
the X direction portions being parallel and the Y direction portions being parallel;
the Y direction portions comprising end regions;
the Y end regions of the direction portions comprising main line portions and offset portions, the offset portions comprising offset elements spaced apart from and electrically connected to the main line portions, the offset portions defining contact areas; and
said offset portions comprise a continuous loop offset portion contacting the main line portion and located to one side of the main line portion, the offset portion and the main line portion completely surrounding an open central region.

2. The integrated circuit pattern according to claim 1, wherein the offset portions are at the end regions.

3. The integrated circuit pattern according to claim 1, wherein the lengths of the X direction portions are least 30 times as long as the lengths of the Y direction portions.

4. The integrated circuit pattern according to claim 1, wherein the second pitch is at least 2 times larger than the first pitch.

5. The integrated circuit pattern according to claim 1, wherein the second pitch is at least 4 times larger than the first pitch.

6. The integrated circuit pattern according to claim 1, wherein the X direction portions are substantially perpendicular to the Y direction portions.

7. The integrated circuit pattern according to claim 1, wherein the lines comprise word lines or bit lines.

8. The integrated circuit pattern according to claim 1, wherein the lines are lithographically formed lines and the first pitch has a sub lithographic dimension and the second pitch has a lithographic dimension.

9. The integrated circuit pattern according to claim 1, wherein the Y direction portions and the X direction portions define a set of nested ring-like parallel lines.

10. The integrated circuit pattern according to claim 1, wherein the lines are lithographically formed lines and the contact pickup areas have lithographic dimensions.

11. The integrated circuit pattern according to claim 1, wherein said offset portions comprise at least one offset element extending laterally from the main portion.

12. The integrated circuit pattern according to claim 1, wherein at least one said offset portion is positioned along an associated main line portion and comprises elements extending generally parallel to the associated main line portion and generally perpendicular to the associated main line portion.

* * * * *